United States Patent [19]

Kawata et al.

[11] Patent Number: 5,021,686

[45] Date of Patent: Jun. 4, 1991

[54] LOGIC CIRCUIT

[75] Inventors: Atsumi Kawata, Hachioji; Hiroyuki Itoh, Kodaira; Hirotoshi Tanaka, Kitatsuru; Kazuhiro Yoshihara, Nishitama; Hiroki Yamashita, Hachioji, all of Japan

[73] Assignee: Hitachi, Ltd., Tokyo, Japan

[21] Appl. No.: 470,322

[22] Filed: Jan. 25, 1990

[30] Foreign Application Priority Data

Jan. 25, 1989 [JP] Japan .................................... 1-13903
Aug. 11, 1989 [JP] Japan .................................... 1-206744

[51] Int. Cl.$^5$ ................. H03K 19/003; H03K 19/092; H03K 19/094; H03K 4/58
[52] U.S. Cl. .................................... 307/448; 307/443; 307/451; 307/475; 307/482; 307/572; 307/578; 307/581; 307/585
[58] Field of Search ............... 307/443, 446, 448, 468, 307/469, 481, 482, 450–453, 570, 571, 572, 575, 576, 577, 578, 579, 581, 584, 585, 270, 264

[56] References Cited

U.S. PATENT DOCUMENTS

| | | | |
|---|---|---|---|
| 4,445,051 | 4/1984 | Elmasry | 307/448 X |
| 4,546,276 | 10/1985 | Freyman et al. | 307/482 X |
| 4,707,625 | 11/1987 | Yanagisawa | 307/443 X |
| 4,798,972 | 1/1989 | Melanson et al. | 307/448 X |
| 4,798,978 | 1/1989 | Lee et al. | 307/448 X |
| 4,800,303 | 1/1989 | Graham et al. | 307/448 X |

OTHER PUBLICATIONS

IEEE Transactions on Electron Devices, ED-25, No. 6, 1978, pp. 628–639.

Primary Examiner—Stanley D. Miller
Assistant Examiner—David R. Bertelson
Attorney, Agent, or Firm—Fay, Sharpe, Beall, Fagan, Minnich & McKee

[57] ABSTRACT

A logic circuit, most suitable for the NOR gate, logic function and integration on a single chip with a plurality of such logic circuits and other digital circuits receiving the outputs of the logic circuits and the logic circuits themselves connected and cascade, wherein plural groups of input transistors are provided, with a load through the voltage source and one of the groups, field effect transistor between the voltage source and the other group, so that its gate is connected to the node between the load and first group and its source is connected to the output terminal, with the improvement being in finding a leakage load for the field effect transistor through the voltage source, providing a clamping circuit for the gate of the transistor. The clamping circuit can include a transistor having its gate connected to the output with a delay so that it will not come on until after a substantial portion of the rise time of the output has expired. An additional logic output may be taken from the gate of this transistor, preferably through a transistor to match the outputs, so that the logic circuit is provided with two independent outputs useful for providing adjacent logic or digital circuits with a conveniently close terminal for input, and further to take advantage of the isolation of the outputs by providing other directions for both outputs for circuit elements that must remain isolated, for example in cross coupling two logic circuits as a flipflop. One or more of the may be a field effect transistor, particularly provided with boot strapping. For otherwise identical logic circuits as a part of an overall integrated logic circuit, the clamping circuits may differ only with respect to matching respective output voltages or respective output currents with respective fan outs or other characteristics of load circuits to be driven by the outputs. Preferably, all of the elements are constructed of field effect transistors.

75 Claims, 19 Drawing Sheets

LOGIC CIRCUIT

BACKGROUND OF THE INVENTION

The present invention relates to logic circuits, and more particularly to a GaAs single chip integrated logic circuit of ultrahigh speed and low power consumption.

A prior-art technique is discussed in, for example, IEEE Transactions on Electron Devices, ED-25, No. 6 (1978), pp. 628-639. FIG. 6 shows a DCFL (Direct Coupled FET Logic) circuit which is typical as a prior-art example and which is disclosed in the above literature. Here, the circuit is an inverter circuit which includes voltage source nodes 101 and 115, a load FET (field-effect transistor) 601 and a driving FET 602. The load FET 601 is a DFET (depletion type or normally-on type FET), while the driving FET 602 is an EFET (enhancement type or normally-off type FET). When, by way of example, a high level (for example, −0.35 V) is applied as an input signal from an input terminal 112 to the gate electrode of the driving FET 602, an output signal at a low level (for example, −0.85 V) appears at an output terminal 105. In addition, a NOR logic circuit is obtained by disposing a plurality of parallel FETs 602, each with its own gate input.

As a second prior-art example, there is an inverter circuit shown in FIG. 7. Referring to FIG. 7, an input signal is supplied from a terminal 112 to the gates of two driving FETs 702 and 703. A node 705 at which the EFET 703 and a resistor 704 are connected is connected to the gate of an EFET 701. An output signal is derived from a terminal 105. As in the first prior-art example, when the high level is supplied as the input signal, the low level appears at the terminal 105.

A high speed circuit discussed in IEEE Transactions on Electron Devices, ED-25, No. 6 (1970), pp. 628-639 is shown in FIG. 29. It has plus side voltage sources (of, for example, 0 V), 1151, 1152, and a minus side voltage source (of, for example, −2 V) 153, and it is constructed of field-effect transistors "FETs", 1101, 1102, 1104, 1105, and 1106, and a load element 1103 formed of a FET or the like. An input terminal 1155 is connected to the gate electrodes of the FETs 1101 and 1104. Another input terminal 1156 is similarly connected to the FETs 1102 and 1105. An output terminal 1157 is led out of the node between the source of the FET 1106 and the common drain electrodes of the FETs 1104, 1105.

The operation of this FIG. 29 circuit is in accordance with NOR logic that, when a logically high level (for example, −1.4 V) is applied to either the input terminal 1155 or 1156, a logically low level (for example, −2.0 V) appears at the output terminal 1157. The logical operation is chiefly determined by the FETs 1101, 1102 and the load element 1103. By way of example, when the input terminal 1155 is at the high level, current flows through the FET 1101 and the load element 1103, so that the potential of a lead 1120 lowers to approach the voltage of the minus side voltage source 1153. Accordingly, the logically low level (nearly equal to the voltage of the minus side voltage source) appears at the source of the FET 1106, namely, the output terminal 1157. In contrast, when the logically low level is applied to both the input terminals, no current flows through the load element 1103, so that the potential of the lead 1120 becomes nearly equal to the voltage of the plus side voltage source 1151 to turn on FET 1106, and the logically high level appears at the output terminal 1157, because FET's 1104 and 1105 are off.

SUMMARY

As to the prior-art technique shown in FIG. 6, the relationships between the currents of the several portions and the time in the case of the rise of the output current are illustrated in FIG. 8A. Numeral 501 denotes the load driving current which flows out to the output terminal 105, numeral 801 the current through the DFET 601, and numeral 504 the FET driving current through the EFET 602. Before a time TO, the EFET 602 is in an "on" state, and the currents of the EFET 602 and DFET 601 are equal. When the input signal begins to lower at the time TO, the EFET 602 shifts into an "off" state with a lapse of time. Therefore, the current 504 of the EFET 602 decreases abruptly with the lapse of time, and a difference obtained by subtracting the current 504 of the EFET 602 from that 801 of the DFET 601 becomes the load driving current 501. With this load driving current, a load capacitance needs to be charged up as fast as possible. In the first prior-art technique, the load driving current 501 is supplied from only the DFET 601, and it decreases with the lapse of time. This leads to the problem that a long time is expended in charging up the load capacitance.

The relationships between the currents of the several portions and the time in the case of the rise of the output in the second prior-art technique shown in FIG. 7 are illustrated in FIG. 8B. Numeral 504 indicates the FET driving current through the EFET 702, and numeral 505 the current through the load FET 701. Before a time TO, since the EFET 703 is in an "on" state, the potential of the node 705 is at the low level, and the EFET 701 is supplied with the low level, so that this EFET is in an "off" state. Accordingly, the EFT 702 falls into an "off" state. When the input signal begins to lower at the time TO, the EFET 703 turns "off" from the "on" state, and the potential of the node 705 rises. Therefore, the load EFET 701 shifts into an "on" state and causes the current 505 to flow. As a result, the load driving current 501 flows to the output terminal 105. Even in the second prior-art technique in FIG. 7, only the EFET 701 can charge up a load capacitance. Moreover, unless the potential of the input signal becomes lower than the threshold voltage of the EFET 703, the node 705 does not reach a supply voltage 101, and this leads to the problem that a long period of time is required since the time TO until the EFET 701 causes a sufficient current to flow.

An object of the present invention is to eliminate the prior art drawback that the load driving current is little at the rise of the output signal and to provide a logic circuit which enhances load driving capability at the rise of the output.

The object is accomplished by adding an assistant FET and an assistant logic circuit as load elements for driving the load. Since these elements can be made much smaller than the original elements, the area of the circuit merely increases to some extent as compared with that of the prior-art circuit.

When the potential of the input signal of the assistant NOR circuit has become lower than a threshold voltage and the output of the assistant NOR circuit has reached the potential of the voltage source, the assistant FET turns "on" and changes up the load capacitance. Thus, the circuit is permitted to supply the load driving current from both the load element and the assistant FET.

As a result, the current which can be caused to flow per unit time increases, and the delay time at the rise of the output can be shortened, so that the prior art problems can be solved.

The output voltage value of the logically high level at the output terminal 1157 depends upon the form of a gate circuit at the succeeding stage. When quite the same circuit as in FIG. 29 is connected in cascade, the logically high level at the output terminal 1157 of an initial stage becomes the input of the next stage at a level which is $V_f$ higher than the voltage of the minus side voltage source of the next stage. Here, $V_f$ denotes the forward bias of a Schottky junction which is formed between the gates and sources of the FETs 1101 and 1104 of the next stage when the input terminal 1155 of the next stage is assumed to be at the high level by way of example. Assuming that the forward bias $V_f$ is about 0.6 V, the high level becomes about $-1.4$ V when the voltage of the minus side voltage source is $-2$ V.

The FETs 1104 and 1105 serve to shorten a delay time. Especially when the input signals rise, FETs 1104 and 1105 discharge a load capacitance at high speed, thereby to quicken the fall of the output signal at output terminal 1157. On the other hand, when the inputs lower, the FET 1106 charges the load capacitance at high speed, thereby to quicken the rise of the output signal at output terminal 1157.

A problem in the prior-art technique shown in FIG. 29 is that variation in a circuit current is large.

It is assumed that plural circuits as shown in FIG. 29 are connected in cascade. The circuit at any desired stage and the circuit at a stage succeeding it shall be respectively called the "initial stage" and the "next stage". Consider a case where the FETs 1102 and 1105 do not exist. The output terminal 1157 of the initial stage is assumed to be connected to the input terminal 1155 of the next stage.

When the point of the connection between stages is at the logically low level, current flows from the FET 1106 of the initial stage through the FET 1104 of the initial stage. The value of this current is determined by the difference between the potential of the lead 1120 and that of the output terminal 1157. Current does not flow to the next stage from the connection between stages.

In contrast, when the point of the connection is at the logically high level, the FET 1104 of the initial stage is cut off and causes no current to flow, and a current path extends from the FET 1106 of the initial stage to a Schottky diode which is formed between the gates and sources of the FETs 1101 and 1104 of the next stage. The potential of the output terminal 1157 is determined so as to equalize currents which flow through the Schottky diode and the FET 1106, whereby the current value is determined.

However, the Schottky diode and the FET have the current-voltage characteristics of an exponential function and a square function, respectively, and they respond to voltages very sensitively, thereby to determine the current. Accordingly, when the potential difference between the lead 1120 and the minus side voltage source 1153 changes even slightly, the current changes greatly. Since in the case of a high at the point of connection, the lead 1120 is nearly equal in potential to the plus side voltage source, the current of this circuit changes greatly, depending upon the supply voltage.

Moreover, even when the supply voltage does not change, the current to flow to the next stage changes greatly, depending upon the threshold voltage $V_{th}$ of the FET 1106.

That is, the prior-art technique has the problem that, since the circuit current depends greatly upon the supply voltage and the voltage $V_{th}$ of the FET 1106, variations in characteristics, especially the delay time etc., become very large.

An object of the present invention is to eliminate the great dependency of the circuit current upon the supply voltage and the voltage $V_{th}$ of the FET as stated above, and to provide a logic circuit of small variations and stable operation.

The logic circuit of the present invention has a clamping circuit for clamping the potential of the output node of a logic portion connected in parallel with an FET and other elements which determine current through the output node, and the potential difference between the output node of the logic portion and a voltage source is held constant against the change of the voltage of the voltage source by the clamping circuit.

In addition, elements similar to the FET and other elements which determine the current at the output node are employed for the clamping circuit, whereby very stable characteristics are achieved even against variation in the threshold voltage $V_{th}$ of the FET.

Since the clamping circuit is disposed in parallel between the gate electrode of the FET of an initial stage and the N-electrode of a Schottky diode of the next stage, namely, the minus side voltage source, it functions to hold the potential difference between the electrodes of the Schottky diode constant even against the fluctuation of the voltage of the voltage source. Accordingly, the variation of the current to flow to the next stage can be made very small. In addition, the clamp circuit is constructed of a FET and a Schottky diode that have characteristics matching the initial stage FET and next stage Schottky diode, respectively whereby the current to flow to the next stage does not change due to the $V_{th}$ variation of the FET.

BRIEF DESCRIPTION OF THE DRAWINGS

Further objects, features and advantages of the present invention will become more clear from the following detailed description of a preferred embodiment, shown in the drawing, wherein.

DETAILED DESCRIPTION OF THE PREFERRED EMBODIMENT

Now, embodiments of the present invention will be described with reference to the drawings.

Figure 1:
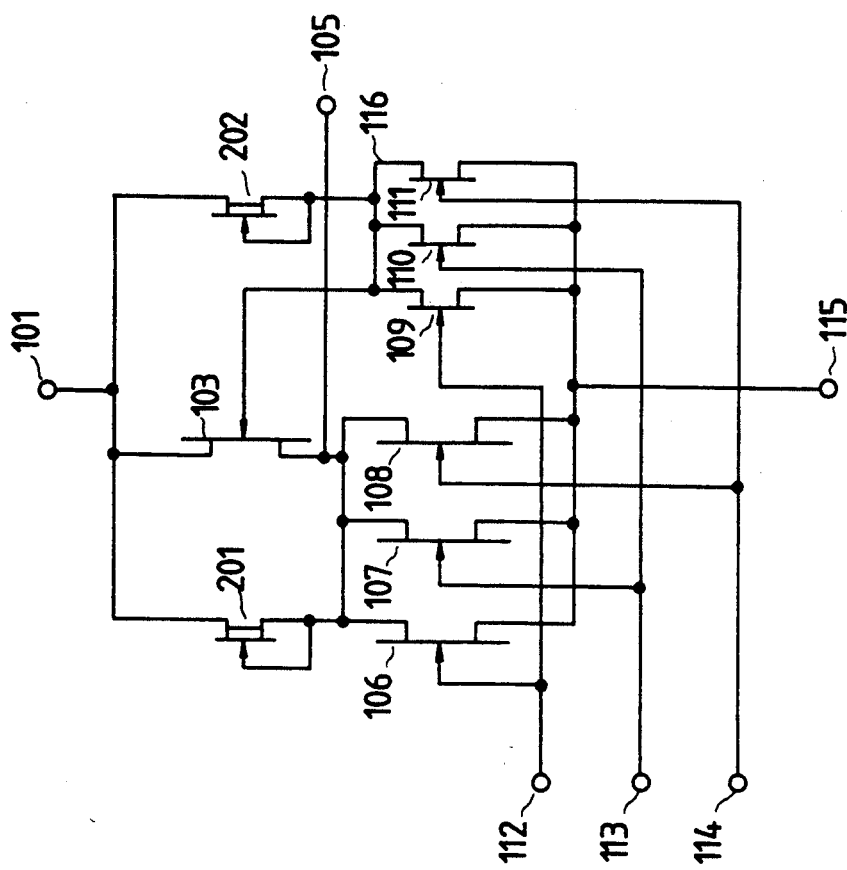
FIG. 1 is a diagram of the fundamental arrangement of the present invention.

The first embodiment is shown in FIG. 1. Driving EFETs 106, 107 and 108 are respectively supplied with input signals 112, 113 and 114. The common drains of these driving FETs 106, 107 and 108 have a load element 102 and the source of an assistant FET 103 connected thereto, and they are also connected to an output terminal 105. An assistant NOR circuit is such that driving FETs 109, 110 and 111 are respectively coupled to the input signals 112, 113 and 114, and that the common drains thereof are connected to a load element 104. Further, the node between the common drains and the load element 104 is connected to the gate of the assistant FET 103. The other sides of loads 102 and 104 are commonly connected with the voltage source node 101 and the drain of FET 103.

Figure 5:
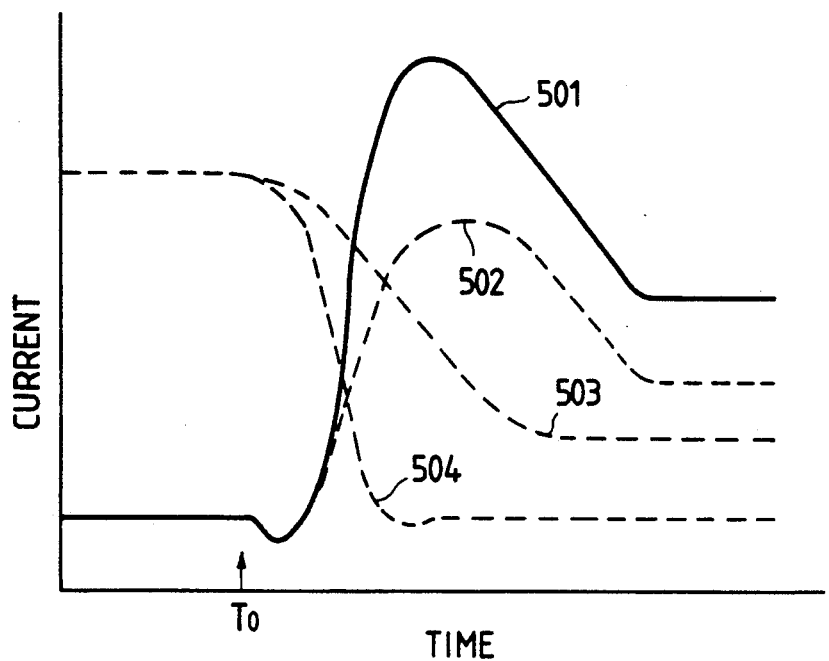
FIG. 5 is a graph showing the relationships between the currents of principal portions in FIG. 1 and time.
Figure 6:
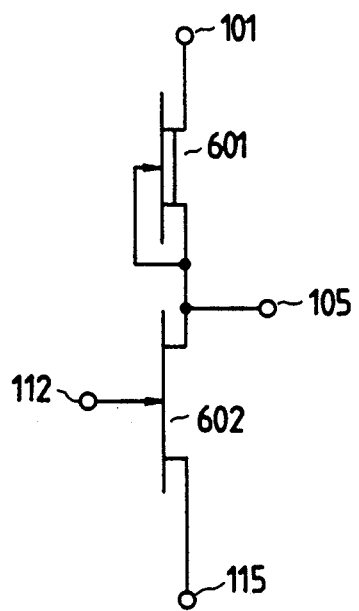
FIGS. 6 and 7 are diagrams each showing a prior-art example.

The relationships between the currents and the time in the case of the rise of the output of the circuit of FIG. 1, are illustrated in FIG. 5. It is assumed that, before a time TO, a high level is supplied to the input terminal 112, whereas a low level is supplied to the input terminals 113 and 114. Since the input terminal 112 is at the high level, the FETs 106 and 109 are in "on" states, and the current 503 of the load element 102 is equal to the current 504 flowing through the EFET 106. When the input terminal (input signal) 112 switches from the high level to the low level at the time TO, the current 504 of the EFET 106 immediately begins to decrease with the lapse of time. Consequently, a current component obtained by subtracting the decreasing current of the EFET 106 from the current of the load element 102 can be utilized for driving a load. Further, in the assistant NOR circuit, the EFET 109 falls into an "off" state when the input signal 112 begins to shift to the low level. Consequently, the node 116 becomes substantially equal to a supply voltage 101, which brings the assistant FET 103 into an "on" state. As a result, the current 502 flows through the assistant FET 103. This current 502 can also be utilized for driving the load. Accordingly, the load driving current 501 which flows out to the output 105 becomes a component which is obtained by subtracting the current of the driving FET 106 from the currents of both the load element 102 and the assistant FET 103. As stated above, the current of the driving FET 106 decreases abruptly, so that the load driving current 501 becomes nearly equal to the sum between the currents 502 and 503. Accordingly, the load driving current increases sharply, and the rise time of the output voltage shortens.

Figure 8A:
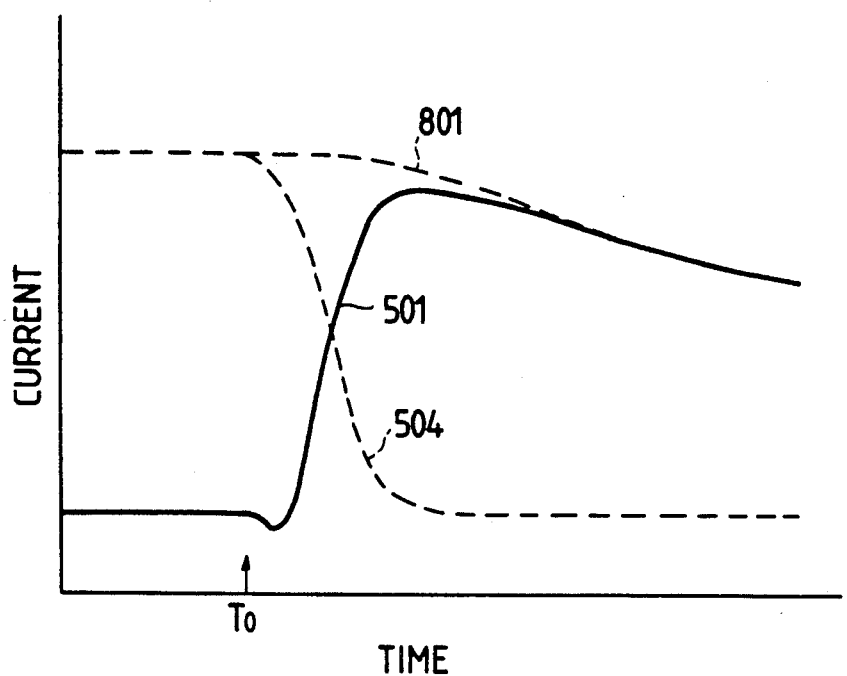
FIGS. 8A and 8B are graphs each showing the relationships between the currents of several portions and time.

Meanwhile, as understood by comparing FIG. 5 and FIG. 8A, the currents before the time TO and after the shifts have ended are substantially equal, so that power consumptions are equal. Nevertheless, in this embodiment, the load driving current 501 can be enlarged during the shift mode only.

Figure 8B:
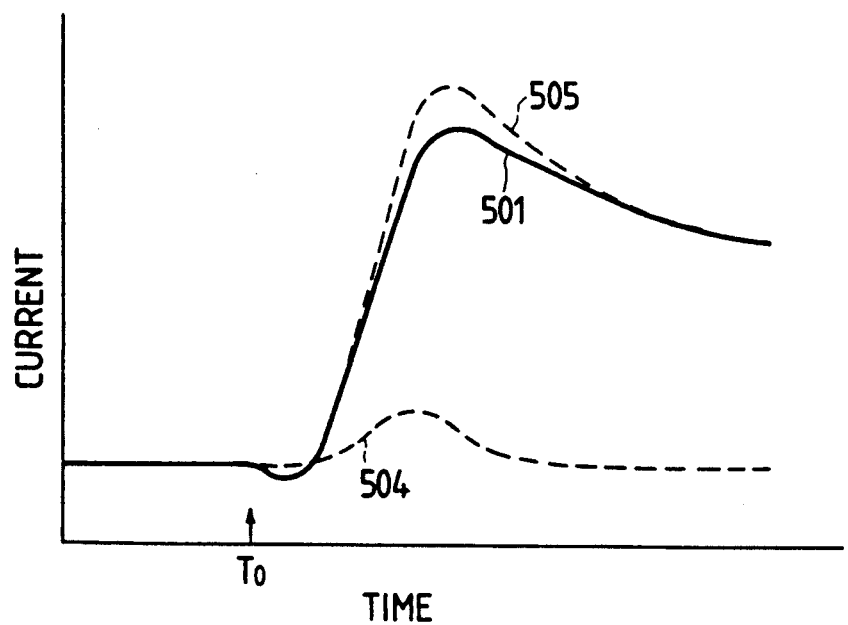

In addition, when FIG. 5 is compared especially with FIG. 8B, it is understood that, in this embodiment, the time at which the load driving current 501 begins to increase abruptly is much earlier. This is because, as stated above, the output current 501 of the present invention is the sum of the current 503 of the load element 102 and the current 502 of the assistant FET 103.

Figure 2:
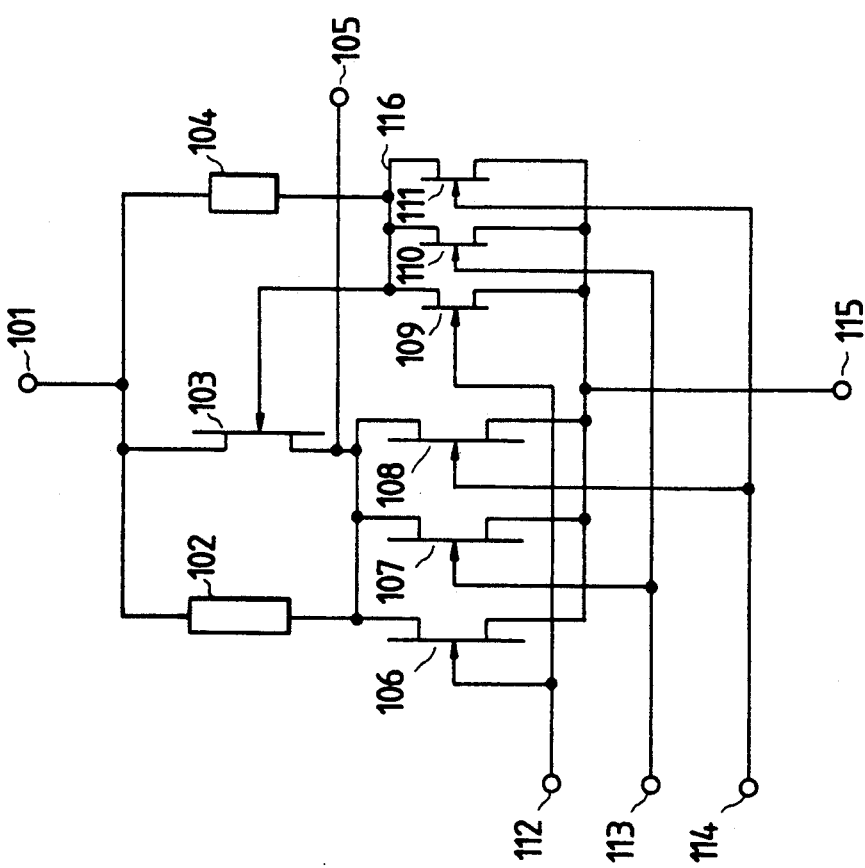
FIGS. 2 thru 4 are diagrams each showing an embodiment of the present invention.

FIG. 2 shows an embodiment where the load elements 102 and 104 in FIG. 1 are replaced with depletion-mode FETs (DFETs) 201 and 202, respectively. Also in this circuit, the load driving current is supplied from the FET 201 and the assistant FET 103, whereby the rise time can be shortened.

The assistant FET 103 and the assistant NOR circuit elements 109-111 can be made small as compared with the original elements 106-108 and 201. This is based on the fact that, since the assistant NOR circuit may drive only the EFET 103, the current thereof can be set slight. Accordingly, the circuit area of the embodiment merely increases to some extent with respect to that of the prior-art circuit. By way of example, comparisons will be made as to a gate width which is proportional to an element area. Whereas the gate width of each of the EFETs 106-108 is 200 μm, that of each of the FETs 109-111 for the assistant NOR circuit is 10 μm, and that of the assistant FET 103 is 66 μm. As a result, the increase of the circuit area for the present invention is 10% or less of the prior art circuit area, and it poses no significant problem. Also in the other embodiments, similarly no problem is incurred as regards the circuit area.

Figure 3:
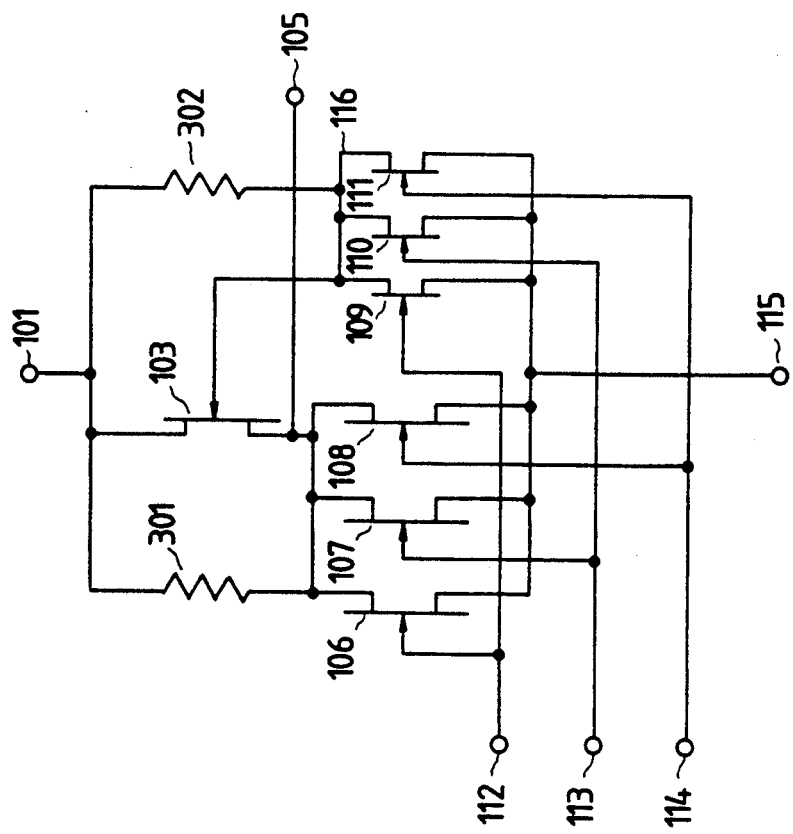

In the embodiment shown in FIG. 3, the load elements 102 and 104 of the embodiment in FIG. 1 are respectively replaced with resistors 301 and 302. In this circuit arrangement, the load driving current is supplied from the resistor 301 and the load driving FET 103, whereby the delay time of the rise is to shortened when compared with the prior art.

Figure 4:
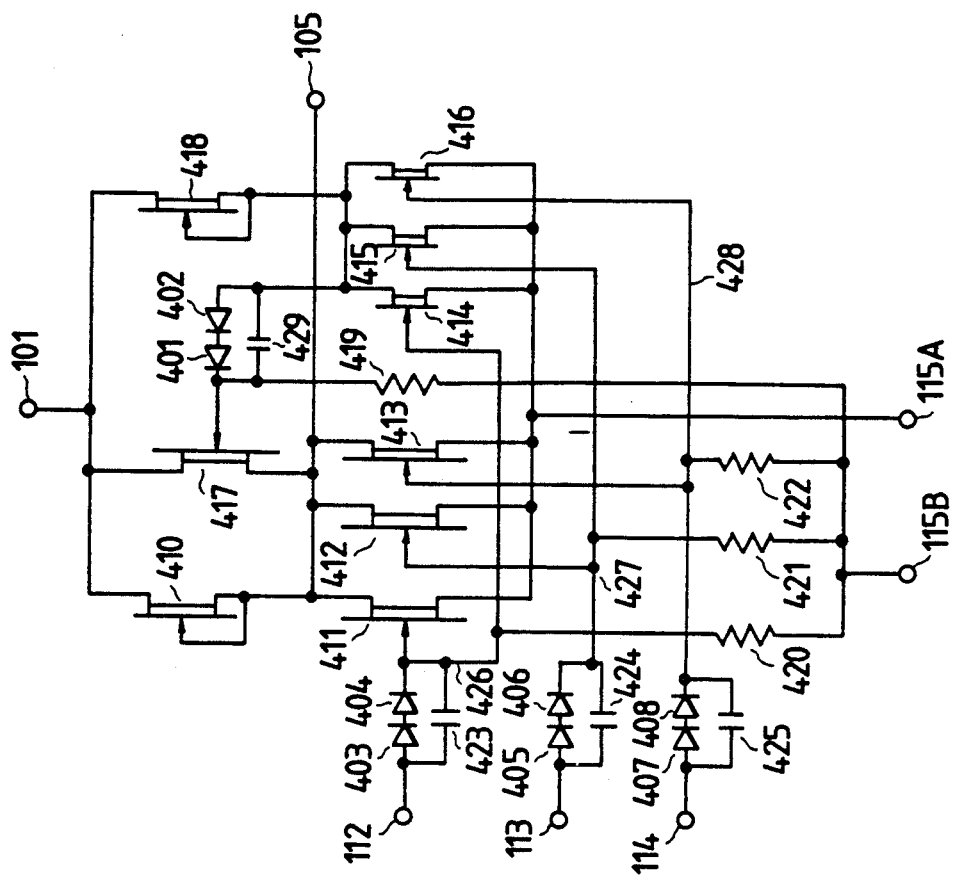

FIG. 4 shows still another embodiment. This embodiment is an example of the present invention applied to an inverter circuit, such as that of the prior art shown in FIG. 9.

Figure 9:
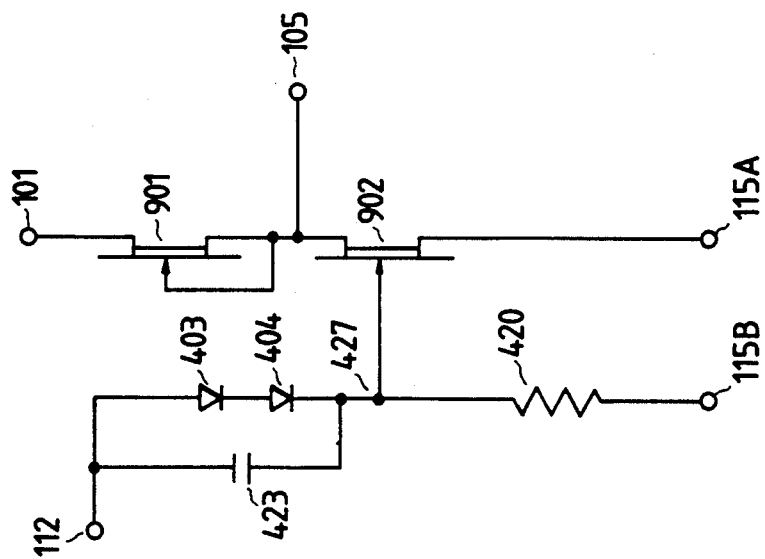
FIG. 9 is a diagram showing a prior-art example constructed of DFETs and a level shift circuit.

The circuit of FIG. 9 is constructed of a driving DFET 902, a DFET 901 for a load element, voltage sources 101, 115A, 115B, input 112, output 105, and a level shift circuit configured of level shift diodes 403 and 404, a resistor 420 and a capacitor 423.

The basic circuit of FIG. 9 is repeatedly seen in FIG. 4 where capacitors 423, 424, 425, nodes 426-428, diodes 403-408, resistors 420-422, and FETs 411-413, and FET 410 correspond to capacitor 423, node 427 diodes 403, 404, resistor 420, FET 902 and FET 901, respectively, in the basic configuration of FIG. 9. Additionally, FETs 414-416, FET 418, and FET 417 correspond to FETs 109-111, load 104, and FET 103 of FIG. 1. To this are added diodes 401, 402, capacitor 429 and resistor 419.

The load driving current is supplied from a DFET 410 being a load element and from an assistant DFET 417, and the rise time is shortened as in the embodiments shown in FIGS. 1 thru 3.

Figure 10:
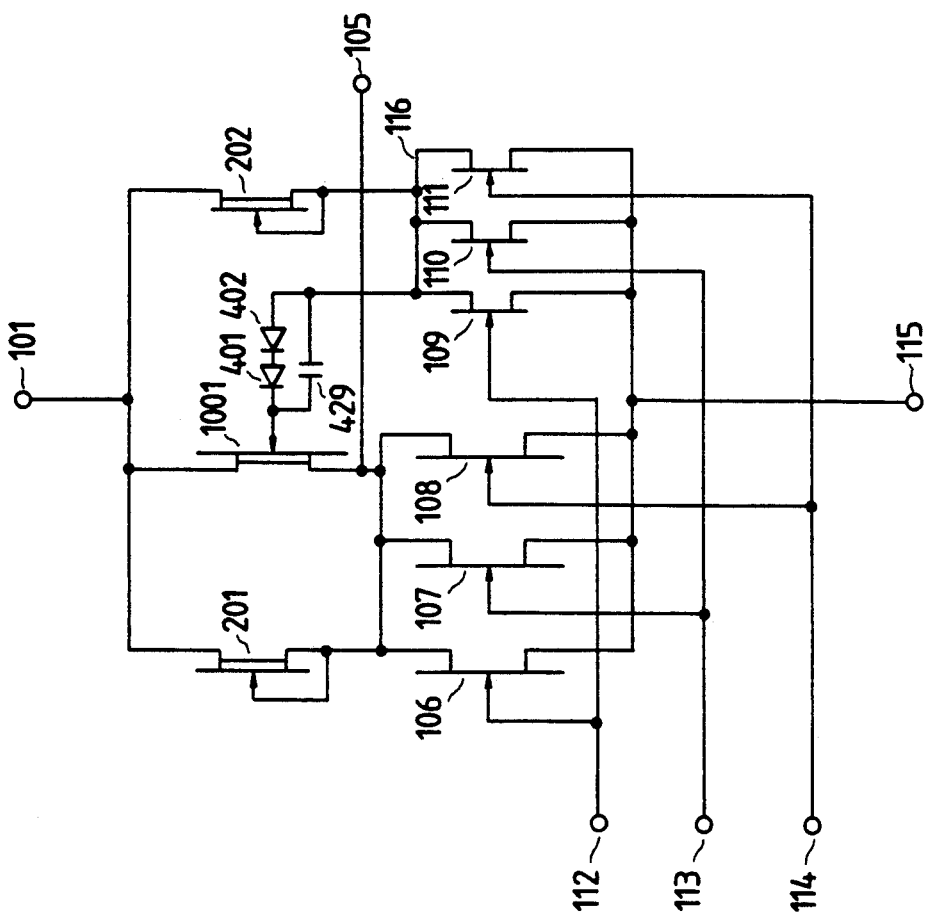
FIGS. 10 and 11 are diagrams each showing an embodiment of the present invention.

FIG. 10 shows another embodiment. This embodiment is a circuit where the assistant FET 103 of the embodiment in FIG. 2 is replaced by a DFET 1001 and where a level shift circuit is inserted between the gate of the assistant FET 1001 and the node 116. In this circuit, the load driving current is supplied from the FET 201 and the FET 1001, thereby shortening the rise time.

Figure 11:
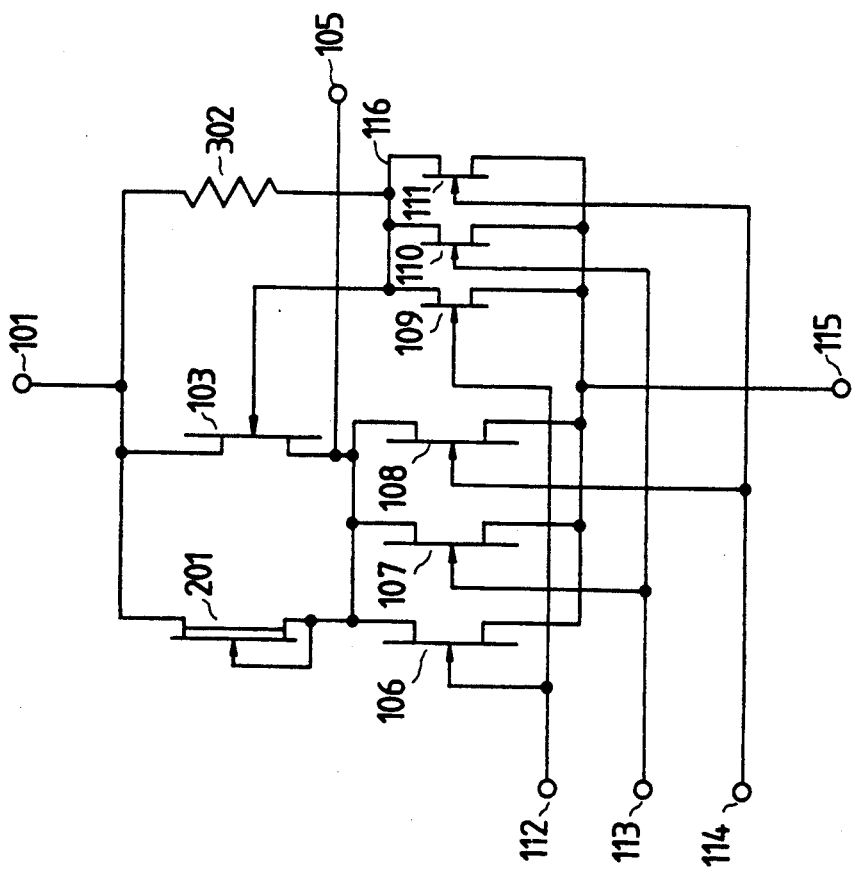

FIG. 11 shows another embodiment. This embodiment is a circuit where the load FET 202 of the assistant inverter of the embodiment in FIG. 2 is replaced by a resistor 302. In this circuit arrangement, the load driving current is supplied from the FET 201 and the FET 103, thereby shortening the rise time.

It is to be understood from the foregoing that, besides the embodiments in FIGS. 1, 2, 3, 4, 10 and 11, the proper combinations thereof can produce the effects of the present invention. Moreover, although the above description has always referred to the operation of the rise of the output, the current of the assistant FET decreases abruptly also at the fall of the output, whereby the current of the driving FET 106 can be utilized for the drive of the load more effectively, which brings forth the effect that the delay time of the fall of the output is shortened.

As described above, according to the present invention, a logic circuit of high load driving capability can be constructed.

Figure 12:
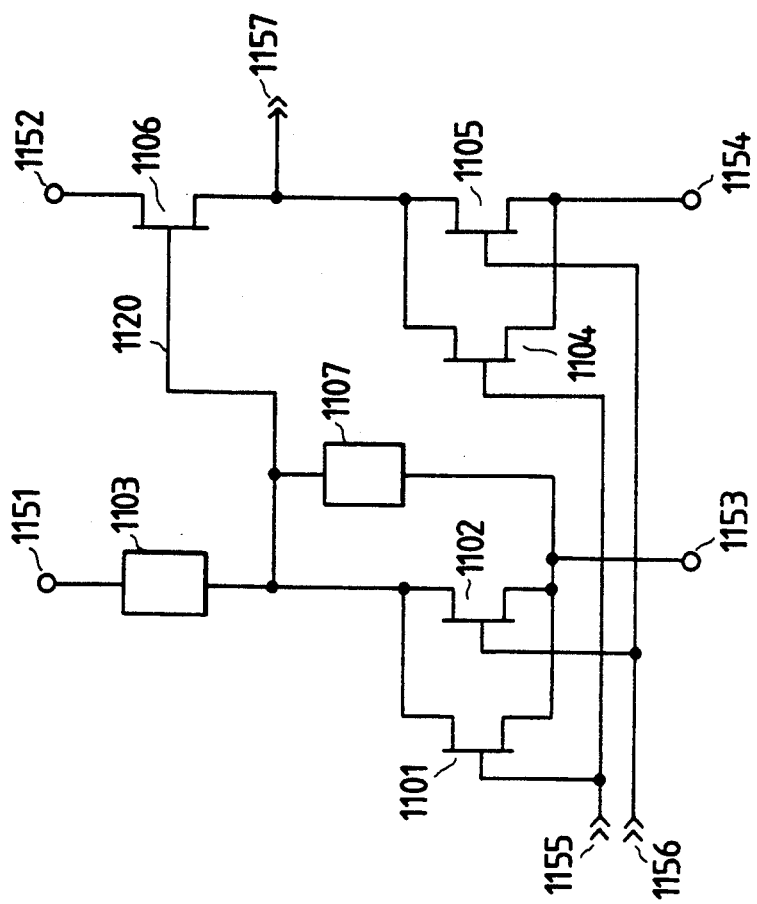
FIG. 12 is a diagram showing a fundamental construction of the present invention.
Figure 29:
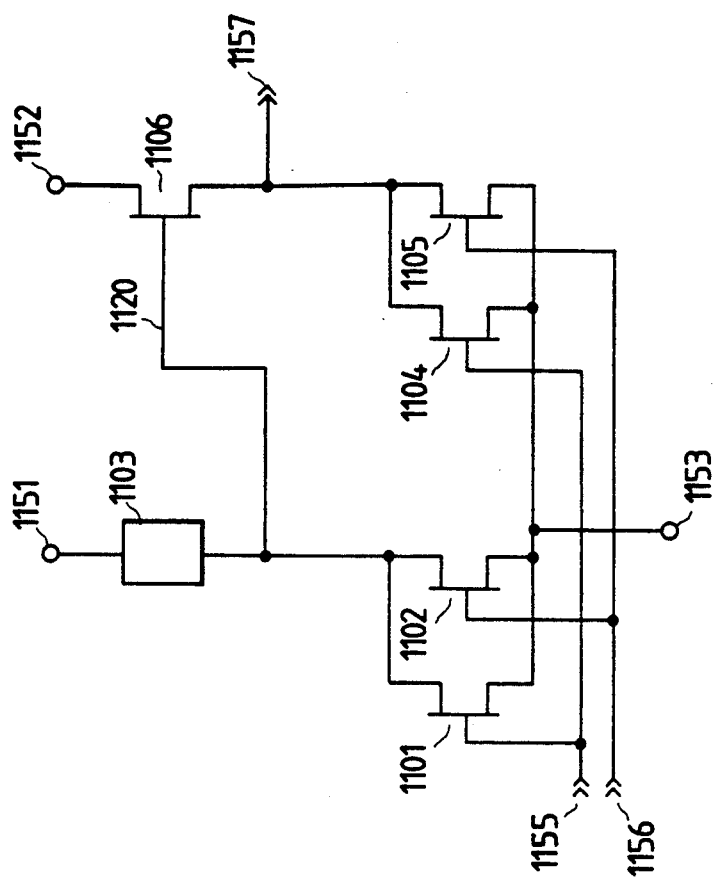
FIG. 29 is a diagram showing a prior-art example.

FIG. 12 shows one embodiment of the present invention. This circuit operates under plus side voltage sources 1151, 1152 and minus side voltage sources 1153, 1154 in such a manner that an output signal is produced at an output terminal 1157 in response to input signals which are applied to input terminals 1155, 1156. The logic function is the NOR logic similarly to that of the prior-art example in FIG. 29. Numerals 1101, 1102, 1104 and 1105 designate FETs to which the input signals are applied, and numeral 1106 designates a driving FET for pull-up which serves to heighten a driving capability for a load capacitance parasitic to the output terminal 1157. A load element 1103 provides a voltage drop across it in response to the input signals applied to the input terminals 1155 and 1156. As a result, the output signal of logically high or low level appears at the node or lead 1120 and at the output terminal 1157. A clamp device 1107 plays the central role of this embodiment.

Figure 13:
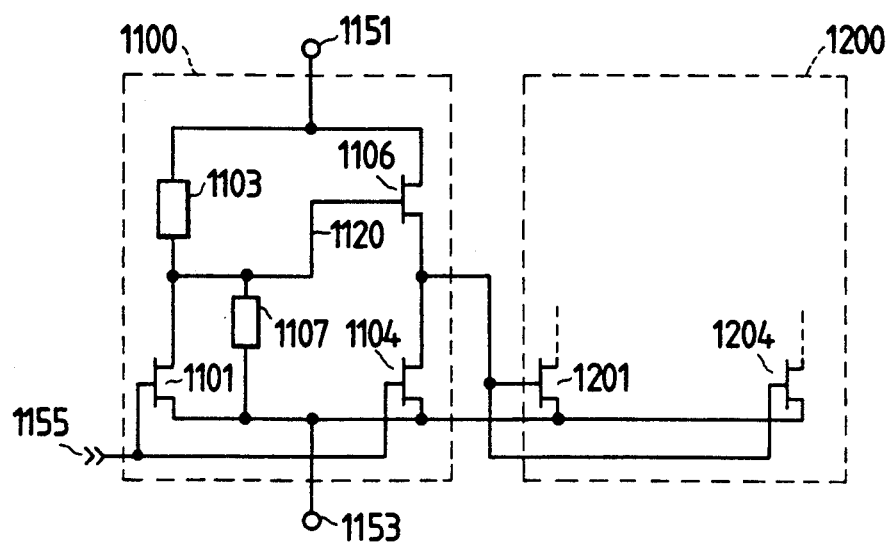
FIGS. 13 thru 28 are diagrams each showing an embodiment of the construction of FIG. 12 of the present invention.

In order to describe this embodiment in detail, reference will be had to FIG. 13. Here, for the sake of brevity, the plus side voltage sources 1151 and 1152 and the minus side voltage sources 1153 and 1154 are respectively made common, and only one input terminal is provided. Besides, the figure illustrates one circuit at any desired "initial stage" and only part of a similar "next stage" circuit connected to the output terminal of the initial stage, for plural cascaded circuits. That is, FETs 1201, 1204 within the circuit 1200 of the next stage correspond to FETs 1101, 1104 of the circuit 1100 of the initial stage.

When the input signal at the high level is applied to the input terminal 1155 of the circuit 1100, the FETs 1101 and 1104 fall into conductive states, and current flows from the load element 1103 through the FET 1101. As a result, the lead 1120 obtains a potential near the voltage of the minus side voltage source 1153. In accordance with the potential at lead 1120, a comparatively small current flows from the FET 1106 to the FET 1104. No current flows to the circuit 1200 of the next stage.

On the other hand, when the input signal of the circuit 1100 is at the low level, the FETs 1101 and 1104 fall into nonconductive states, so that the current from the load element 1103 flows to the clamp device 1107 without flowing through the FET 1101. As a result, owing to a voltage drop across the clamp device, the lead 1120 has a potential higher than the voltage of the minus side voltage source by the voltage drop across the clamp device 1107. Besides, the source-gate voltage of the FET 1106 enlarges, so that a comparatively great current is about to flow through the FET 1106. Since, however, the FET 1104 is in the nonconductive state similarly to the FET 1101, the current from the FET 1106 flows to a Schottky diode which is formed between the gate electrodes and source electrodes of the FETs 1201 and 1204 of the next-stage circuit 1200. The present invention stabilizes this current $I_{out}$. In this state, the following relational formula holds:

$$V(1120) = V_{gs}(FET\ 1106) + V_f(FETs\ 1201, 1204) \quad (1)$$
$$= V_f(\text{device } 1107)$$

Here, V (1120) denotes the potential difference between the lead 1120 and the voltage of the minus side voltage source, $V_{gs}$ (FET 1106) the gate-source voltage of the FET 1106, $V_f$ (FETs 1201, 1204) the forward voltage drop of the Schottky diode of the parallel FETs 1201 and 1204, and $V_f$ (device 1107) the forward voltage drop of the device 1107. The current $I_{out}$ is determined by the square function characteristic of $V_{gs}$ (FET 1106) and the exponential function characteristic of $V_f$ (FETs 1201, 1204). Accordingly, although the current $I_{out}$ can greatly change even in case of a slight change in V (1120), this voltage V (1120) is determined by the voltage $V_f$ (device 1107) in the present invention. Therefore, if the current to flow through the device 1107 does not depend considerably upon the supply voltages etc., the changes of the voltages $V_f$ (device 1107) and V (1120) and further changes of the current $I_{out}$ can be made very small.

The influences of the fluctuations in the threshold voltages $V_{th}$ of the FETs can be made very little when elements identical in kinds to the FET 1106 and the Schottky diode of the FETs 1201, 1204 are used for the device 1107. By way of example, when the voltage $V_{th}$ of the FET 1106 has lowered, the current $I_{out}$ fluctuates greatly and enlarges for the same value of the voltage V (1120). However, when the current of the device 1107 is also subjected to the same fluctuation of the voltage $V_{th}$, the voltage drop thereof decreases for a certain current value, and the voltage V (1120) lowers and operates so as to reduce the current $I_{out}$ to the original value thereof.

Figure 14A:
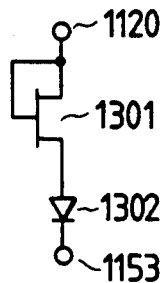

Reference will be had to FIGS. 14(a)–(d) in order to describe the above operation in more detail. FIGS. 14(a)–(d) show several examples of the practicable arrangement of the clamp circuit 1107 in FIGS. 12 and 13. In FIG. 14(a) the clamp circuit is constructed of a series connection consisting of a FET 1301 and a Schottky diode 1302. The FET 1301 is designed to have the same threshold voltage $V_{th}$ as that of the FET 1106. The Schottky diode 1302 is designed to have the same forward voltage $V_f$ as the Schottky diode that receives the output of the initial stage and is formed between the gates and sources of the FETs 1201 and 1204 in the circuit 1200 of the next stage. In practical use, it is considered that elements which are formed in a simultaneously identical semiconductor substrate by implanting an impurity in equal doses at the same energy will have almost equal values of the voltage $V_{th}$ or $V_f$. For the sake of brevity, it is assumed that, also in size, the FET 1301 is equal to the FET 1106, while the Schottky diode 1302 is equal to the Schottky diode formed between the gates and sources of the FETs 1201, 1204. On this occasion, current $I_c$ to flow through the clamp circuit 1107 and the current $I_{out}$ become almost equal. The reason therefor is that the voltage which is applied across the clamp circuit 1107 and the voltage which is applied across the series circuit consisting of the FET 1106 and the Schottky diode between the gates and sources of the FETs 1201, 1204 are the same. Meanwhile, the current value is determined by only the current of the load element 1103 because all the current of the clamp circuit 1107 is supplied from the load element 1103. By setting the characteristics of the load element as desired, accordingly, a desired stable current is attained as the current $I_{out}$. When the sizes of the elements of the clamp circuit are made n times as large as those of the FET 1106 and the Schottky diode between the gates and sources of the FETs 1201, 1204, the current $I_c$ of the clamp circuit is n times as much as the current $I_{out}$.

Figure 14B:
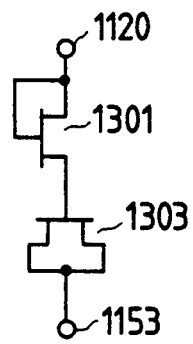
Figure 14C:
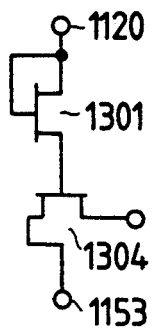

FIG. 14(b) shows another example of the clamp circuit 1107. Here, the Schottky diode 1302 in FIG. 14(a) is replaced with a FET 1303. The gate electrode of the FET 1303 is connected to the source electrode of the FET 1301, and Schottky diodes between the gate electrode of the FET 1303 and the source and drain electrodes thereof are utilized. As shown in FIG. 14(c), it is also possible to use only a Schottky diode between the gate electrode and the source or drain electrode of a FET 1304.

Figure 14D:
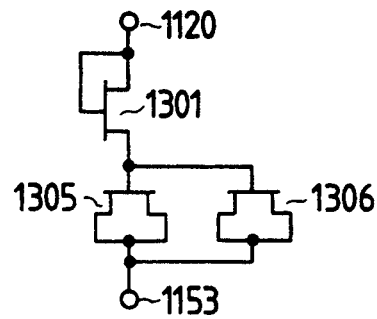
Figure 15:
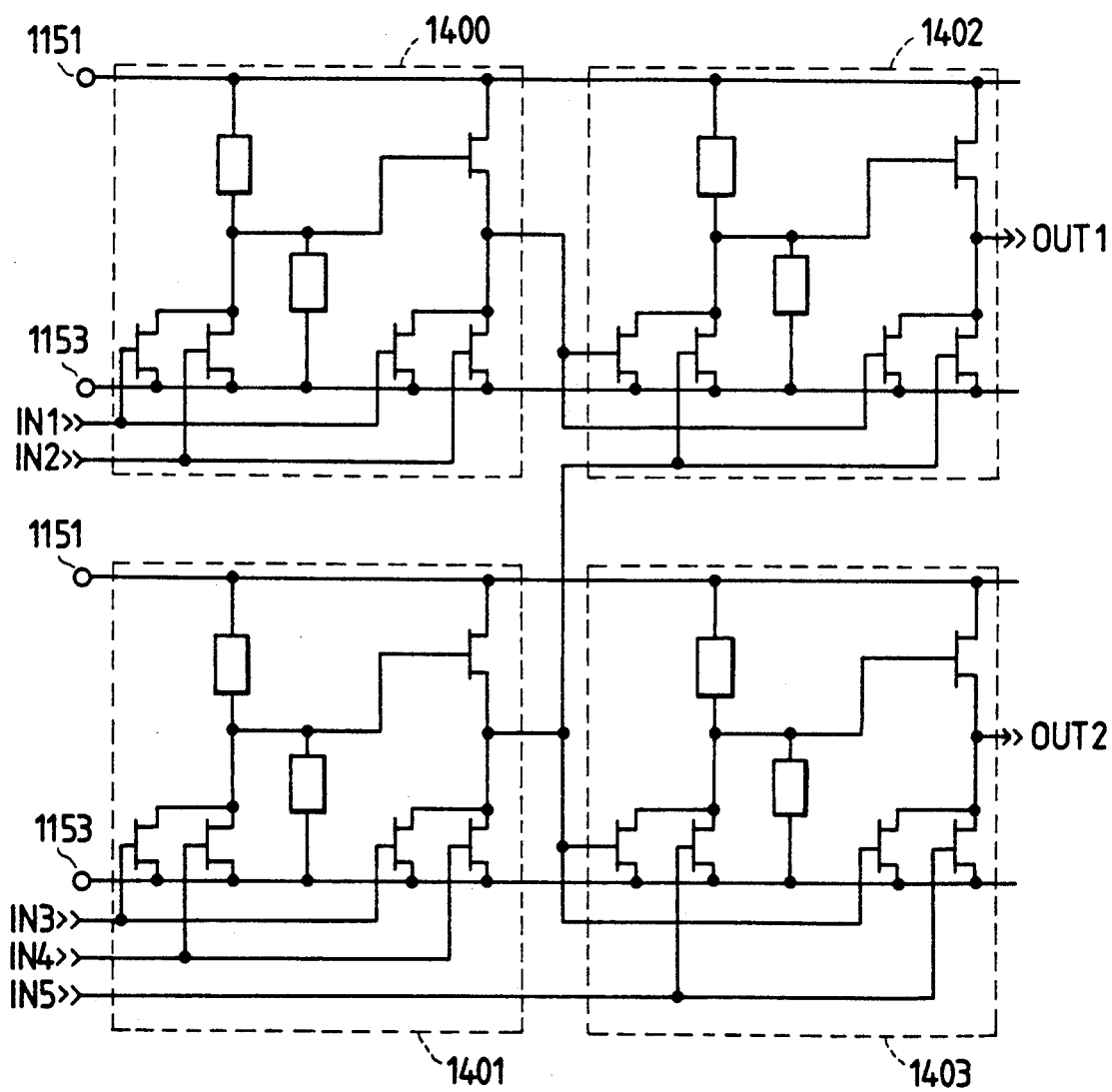

FIG. 14(d) shows still another example of the clamp circuit 1107. Here, the FET 1303 in FIG. 14(b) is replaced with two FETs 1305 and 1306. In this way the voltage drop $V_f$ of the clamp circuit 1107 at a certain value of the current $I_c$ can be readily changed according to the number of the FETs 1305 and 1306. The same effect can be expected by similarly connecting FETs of the same sort in parallel with the FET 1301 or by enlarging the gate width of the FET 1301. Accordingly, the output current $I_{out}$ can be changed. This method is effective when the number of circuits to be connected to the output terminal of one circuit, that is, the fan-out has increased. An example in which the fan-out is two, is shown in FIG. 15. In the figure, four circuits 1400–1403 are interconnected, and the circuit 1400 has a fan-out of one, while the circuit 1401 has the fan-out of two. When the number of fan-out increases in this manner, the current of the Schottky diode enlarges for the same value of the voltage $V_f$(FETs 1201, 1204) in Eq. (1), and hence the current $I_{out}$ increases. On such an occasion, the number of the FETs 1305, 1306 etc. is increased owing to the structure in FIG. 14(d), whereby the voltage $V_f$ of the clamp circuit 1107 can be lowered to reduce the current $I_{out}$.

In a case where the length of interconnection wiring is great and correspondingly the load capacitance is great, it is sometimes required that the resulting large delay time for overcoming this capacitance is shortened by increasing the current $I_{out}$. On this occasion, the number of FETs 1305, 1306 etc. is reduced, whereby conversely to the above, the voltage $V_f$ of the clamp circuit 1107 can be enlarged to increase the current $I_{out}$. Of course, the requirement can also be met by changing the gate widths of the FETs 1305 and 1306.

Except in the special case when the gate width of the FET 1301 is set to be n times that of the FET 1106, the total of the gate widths of the FETs 1305 and 1306 should preferably be made n times the total of the gate widths of the FETs 1201 and 1204 when the fan-out is large, for the purpose of diminishing the temperature characteristics of the FETs and the variations of devices to the utmost. The sequence of connection of the FET 1301 and the Schottky diode 1302 may be reversed in FIG. 14(a). That is, it is also allowed that the anode of the diode 1302 is connected to the lead 1120, that the drain-gate path of the FET 1301 is connected to the cathode of the diode 1301, and that the source of the FET 1301 is connected to the minus side voltage source 1153. This holds true also for FIGS. 14(b)–(d).

Figure 16:
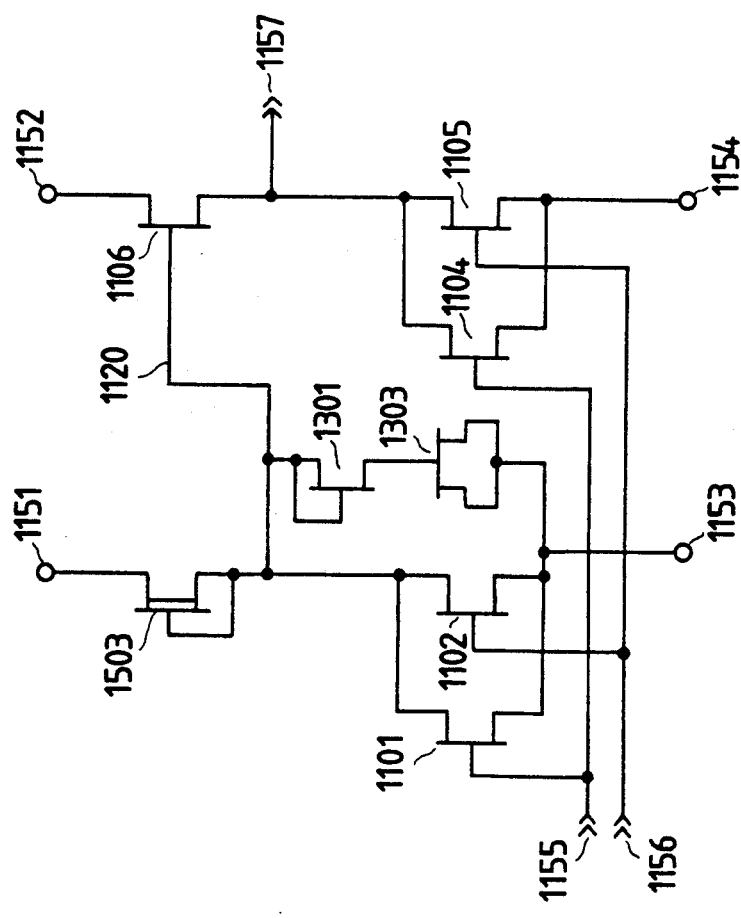

FIG. 16 shows the load element 1103 in FIG. 12. A FET 1503 is a normally-on FET, the gate and source electrodes of which are connected to each other. As a result, when the potential difference between the lead 1120 and the plus side voltage source 1151 is sufficiently great, the current that flows through the FET 1503 becomes substantially constant.

Figure 17:
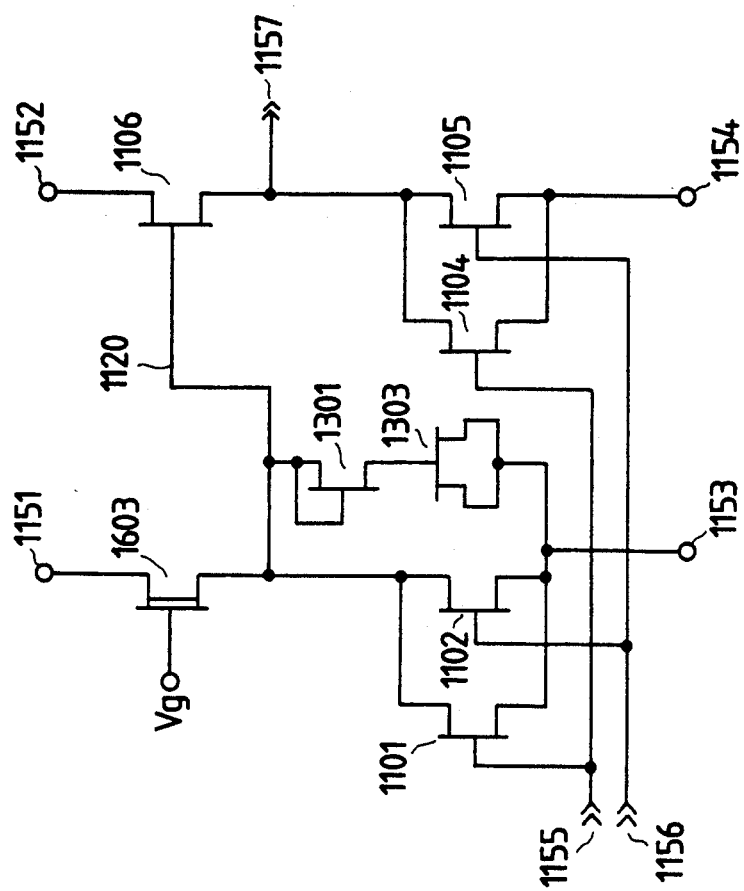

FIG. 17 shows the load element 1103 in FIG. 12 constructed of a normally-on type FET/603, and a certain fixed potential $V_g$ is the gate bias of the FET 1603.

Figure 18:
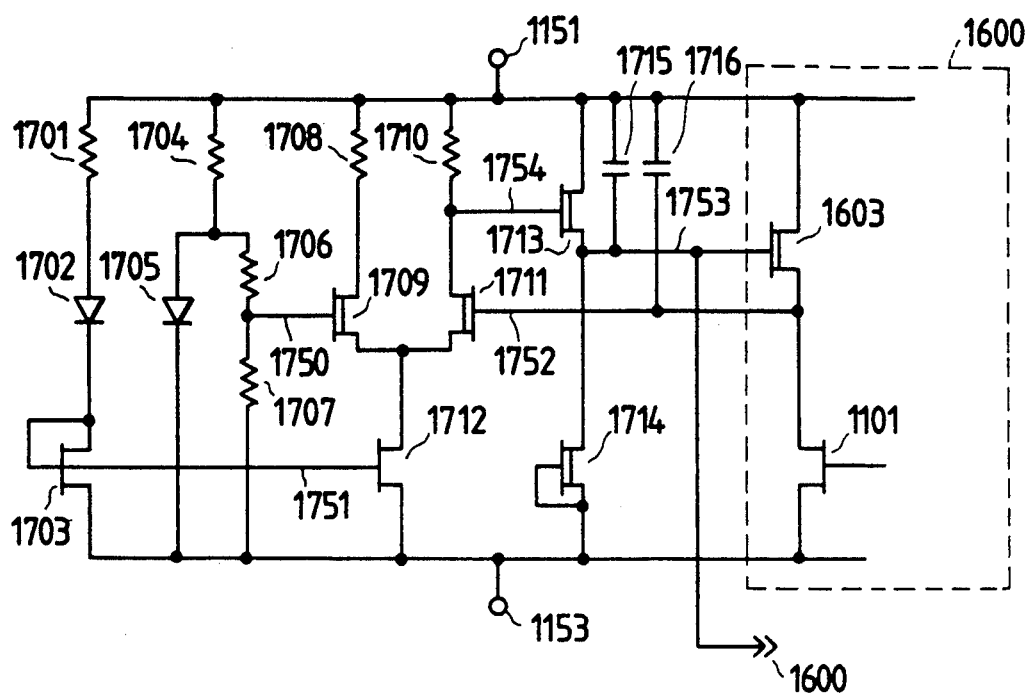

FIG. 18 shows an example of a circuit for generating the potential $V_g$. Here, FETs 1703, 1712 and 1101 are of the normally-off type, and FETs 1709, 1711, 1713, 1714 and 1603 are of the normally-on type. In addition, numerals 1702 and 1705 indicate diodes. This circuit uses the same circuit as in FIG. 17, as a circuit 1600, and it is so constructed that the potential $V_g$ is connected to the gate of the FET 1603 in the circuit 1600 by a lead 1753, while at the same time, the source potential of the FET 1603 is fed back by a lead 1752. The potential of the lead 1752 is automatically adjusted so as to approach the potential of a lead 1750.

The operation of the circuit will be described. The gate electrode of the FET 1709 is supplied with a bias by the lead 1750. The bias is generated by a circuit configured of resistors 1704, 1706, 1707 and the diode 1705. More specifically, a voltage, for example, 0.5 V appears across the diode 1705, and this value hardly changes in spite of some change in the supply voltage if a potential difference across the resistor 1704 is sufficiently great. Therefore, when the divider resistors 1706 and 1707 are connected in parallel with the diode 1705, the divided value of the voltage of the diode 1705 arises at the node 1750 between the resistors 1706 and 1707, and it is hardly affected by the change of the supply voltage. Moreover, since an FET is not used, the divided voltage value is not affected by the threshold voltage $V_{th}$ of the FET. Thus, when the resistance ratio of the resistors 1706 and 1707 is set at 2:3 by way of example, the potential difference between the lead 1750 and the minus side voltage source 1153 becomes 0.3 V. This potential of the lead 1750 and the potential of the lead 1752 fed back from the circuit 1600 are compared by a differential transistor circuit. Assuming now that the threshold voltage $V_{th}$ of the FET 1603 has become lower than its design value, thereby to increase the current, the source potential of the FET 1603 rises on this occasion. Consequently, the potential of the lead 1752 becomes higher than that of the lead 1750. Then, current flows through the FET 1711 more than through the FET 1709, and the potential of a lead 1754 lowers. Accordingly, the potential $V_g$ of the lead 1753 is responsively lowered, and the potential of the lead 1752 is automatically adjusted so as to approach that of the lead 1750. That is, the potential $V_g$ lowers, thereby functioning to restore the current to the expected design value.

A current configured of a resistor 1701, the diode 1702 and the FET 1703 serve to supply the bias potential of the gate of the FET 1712 through a lead 1751. When a potential difference applied across the resistor 1701 is sufficiently great, the potential difference between the lead 1751 and the minus side voltage source 1153 is not influenced by the supply voltage. Accordingly, the current of the FET 1712 is stabilized, and a potential difference across a resistor 1710 and the potential of the lead 1754 become less susceptible to the influence of the supply voltage. A source follower configured of the FETs 1713 and 1714 plays the role of a buffer for connecting the lead 1753 to many circuits 1600. When the gate widths of the FETs 1713 and 1714 are equal, the potentials of the leads 1754 and 1753 become nearly equal because the gate and source electrodes of the FET 1714 are shorted.

According to the circuit of this example, the $V_{th}$ dependency of the current to flow through the FET 1603 can be rendered very little. It is accordingly possible to stabilize the characteristics of the circuit, such as the delay time.

Figure 19:
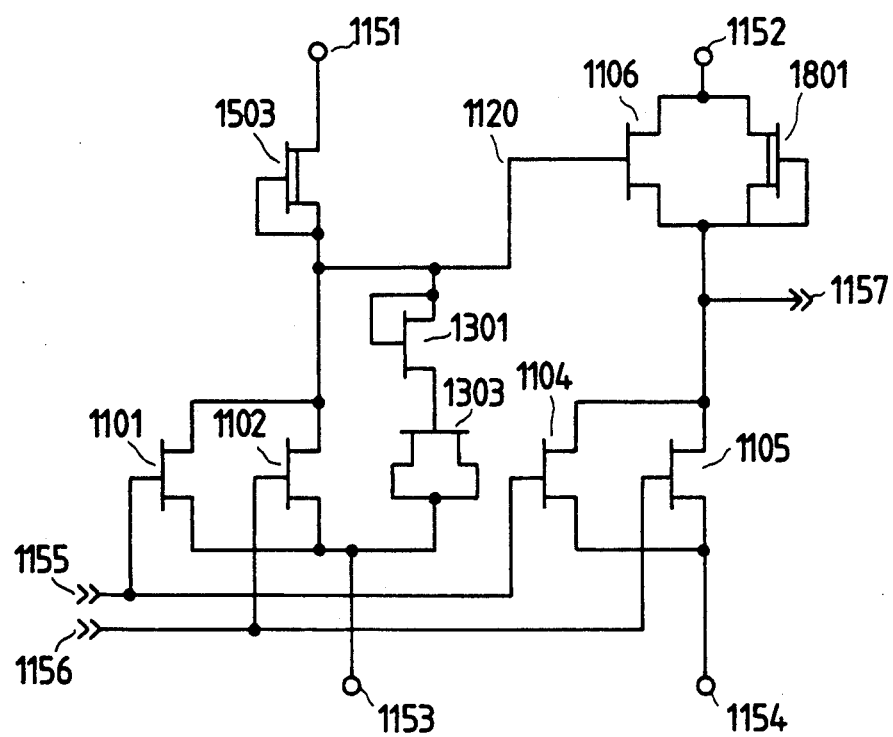

FIG. 19 shows another embodiment of the present invention. This embodiment corresponds to a case where the present invention is applied to a logic circuit proposed in Japanese Patent Application No. 13903/1989. When compared with the embodiment of FIG. 17, the embodiment of FIG. 19 is additionally provided with a FET 1801. Like the FET 1106, FET 1801 functions to quicken the rise of the output signal.

Figure 20:
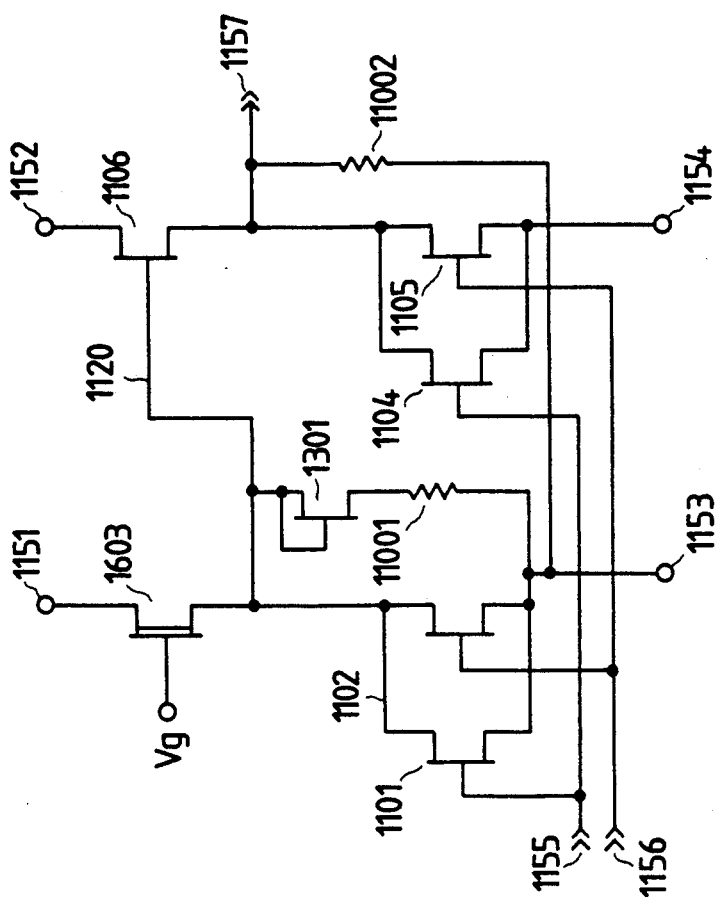

FIG. 20 shows another embodiment of the present invention. In this embodiment, the arrangement of the clamp circuit 1107 is altered relative to the embodiment of FIG. 17. The load element 1603 may well be the FET 1503 as shown in FIG. 16. This embodiment is effective when a higher operating speed is attained in such a way that the amplitude of the signal at the output terminal 1157 is rendered smaller than the $V_f$ (forward voltage drop) of a Schottky diode formed between the gates and sources of the FETs of the next-stage circuit receiving this signal (corresponding to the FETs 1101, 1104 or 1102, 1105 when the next-stage circuit has the same circuit arrangement as that of the initial-stage circuit). For this purpose, a FET 1902 is interposed between the output terminal 1157 and the minus side voltage source 1153. Thus, when the output terminal 1157 is at the logically high level, most of the current does not flow from the FET 1106 to the Schottky diode of the next-stage circuit, but it flows from the FET 1106 to the FET 1902. As a result, in correspondence with Eq. (1), the potential difference V (1120) between the lead 1120 and the minus side voltage source becomes:

$$V(1120) = V_{gs}(FET\ 1106) + V_{gs}(FET\ 1902) \quad (2)$$
$$= V_{gs}(FET\ 1301) + V_{gs}(FET\ 1901)$$

Here, $V_{gs}$ (FET xxx) denotes the gate-source voltage $V_{gs}$ of the FET xxx. In order to hold Eq. (2), the clamp circuit 1107 is configured of the FET 1301 and a FET 1901, the gate electrode is connected to the output terminal 1157 similarly to that of the FET 1902. In this way, as in the description up to FIG. 19, all the current to flow through the clamp circuit is supplied from the load element 1603, so that a desired stable current is attained as the output current $I_{out}$ in conformity with the relationship of Eq. (2).

Figure 21:
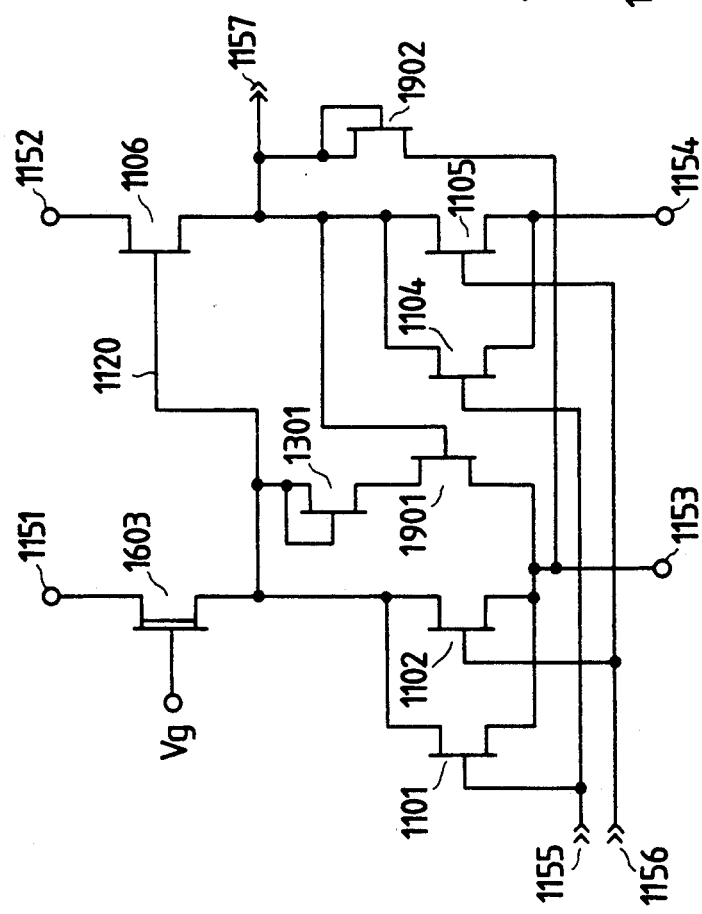

FIG. 21 shows a modification to the embodiment in FIG. 20, and the FETs 1901 and 1902 in FIG. 20 are respectively replaced with resistors 11001 and 11002.

Figure 22:
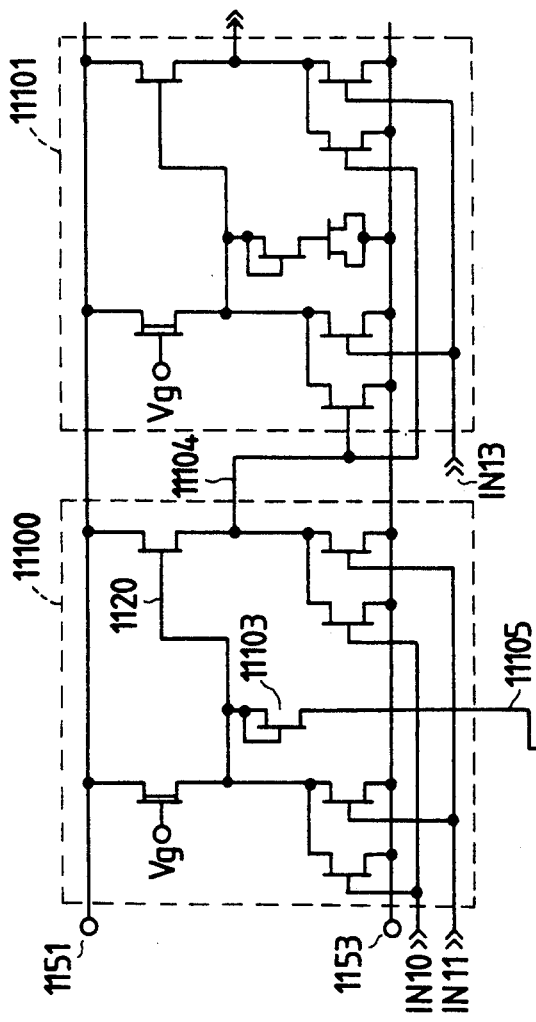

FIG. 22 shows another embodiment of the present invention. Here, a circuit 11100 drives circuits 11101 and 11102. However, the input of the circuit 11101 is connected to the output terminal 11104 of the circuit 11100, and the input of the circuit 11102 is connected to the source electrode of a FET 11103. This construction is effective on such an occasion that the circuit 11102 lies at a position very close to the circuit 11100, whereas the circuit 11101 lies at a position comparatively remote therefrom. Besides, it is very effective in a case where the propagation of a signal to the circuit 11102 is to be prevented from depending upon the magnitude of the load of the output terminal 11104, in this example, the length of wiring to the circuit 11101. In this embodiment, the clamp device in the circuit 11100 is constructed of a series circuit which consists of the FET 11103 and a Schottky diode formed between the gates and sources of FETs 11111 and 11114 in the circuit 11102. That is, the input FETs of the next-stage circuit are used instead of the FET 1303 in FIG. 17. Even when the load of the output terminal 11104 has become heavy, it exerts almost no influence on the response of the lead 1120, and hence, the signal can be sent to the circuit 11102 with a fixed delay time.

Figure 23A:
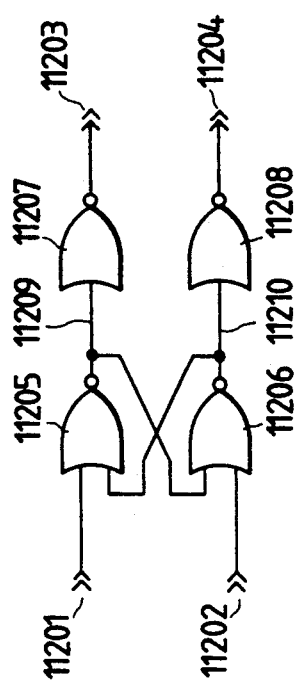
Figure 23B:
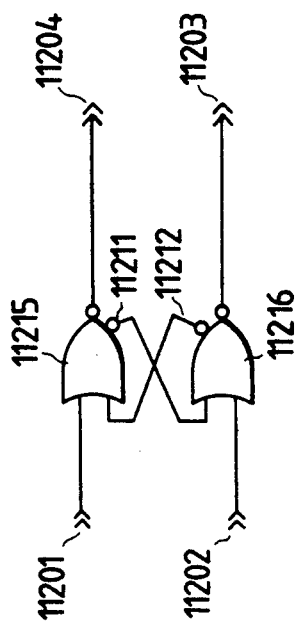
Figure 24:
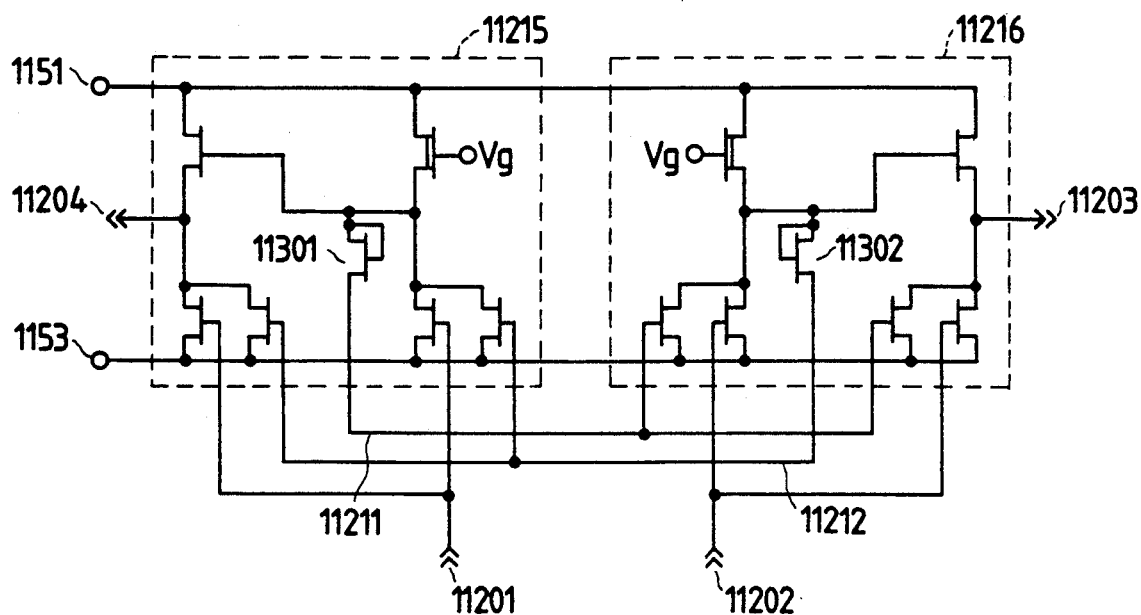

The application of this embodiment will be somewhat detailed. FIGS. 23(a) and (b) show arrangements of "RS flip-flops". In FIG. 23(a), NOR gates 11205 and 11206 constitute an information holding portion. NOR gates 11207 and 11208 serve as buffers for driving a load. Also, they function to prevent the speeds of the feedback operations of the NORs 11205 and 11206 from depending upon the load of the flipflop. This arrangement, however, has not only the disadvantage that the number of the NOR gates is large, but also the disadvantage that delay times involved from input terminals 11201 and 11202 to output terminals 11203 and 11204 become long. When the circuit of FIG. 22 is therefore applied, the arrangement of FIG. 23(b) is realized. Here each of NOR gates 11215 and 11216 has the arrangement of the circuit 11100 in FIG. 22. By way of example, the output terminals 11204 and 11211 of the NOR 11215 correspond respectively to the output terminal 11104 and the source electrode of the FET 11103 in FIG. 22. In more detail, accordingly, FIG. 23(b) is expressed as shown in FIG. 24.

Figure 25:
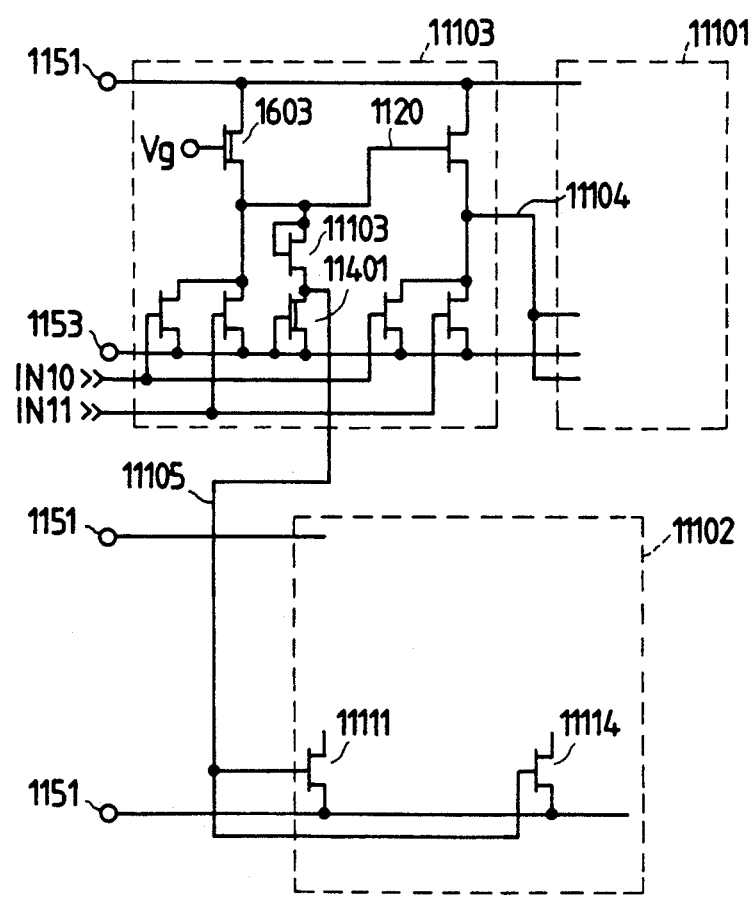

FIG. 25 shows a further embodiment. Here, in order to realize the same function as in the embodiment of FIG. 22, a normally-on type FET 11401 is interposed between the source electrode of the FET 11103 and the minus side voltage source 1153. Since the FET 11401 has its gate electrode and source electrode shorted, it exhibits a constant-current characteristic. In case of setting the current value of the FET 11401 at a comparatively small value, most of the current from the FET 1603 flows from the FET 11103 to the FETs 11111 and 11114 when the input is at the logically low level. That is, the clamp operation for the lead 1120 is determined by a circuit configured of the FET 11103 and the FETs 11111 and 11114, and hence, it is substantially the same as in the foregoing. On the other hand, when the input signal rises, the potential of a lead 11105 is discharged by the FET 11401 so as to rapidly fall. The FET 11401 may well be replaced with a resistor of comparatively high resistance.

Figure 26:
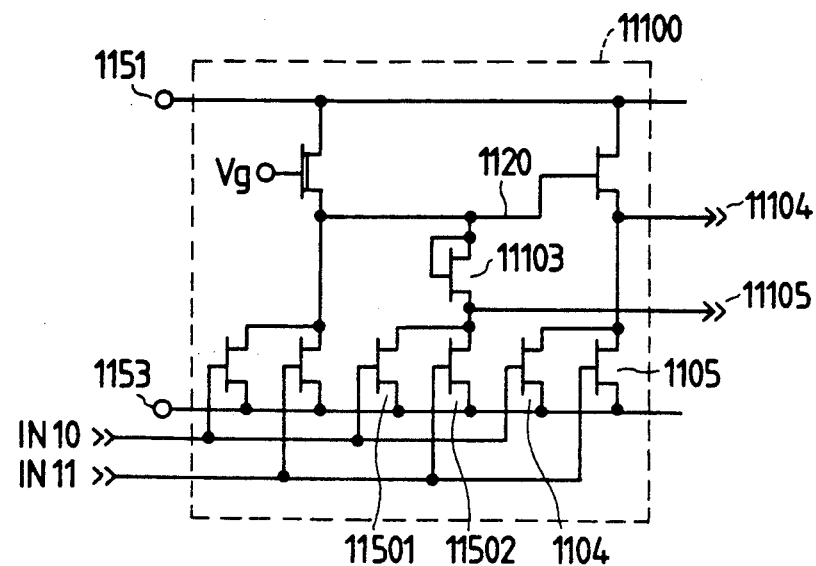

FIG. 26 shows a modification to the embodiment in FIG. 25. In this embodiment, the FET 11401 in FIG. 25 is substituted by FETs 11501 and 11502. The gate electrodes of the FETs 11501 and 11502 are respectively connected to input terminals In10 and In11. This serves to quicken the fall of the second output terminal 11105, and the output terminal 11105 is rapidly lowered when the input terminal In10 or In11 rises.

Figure 27:
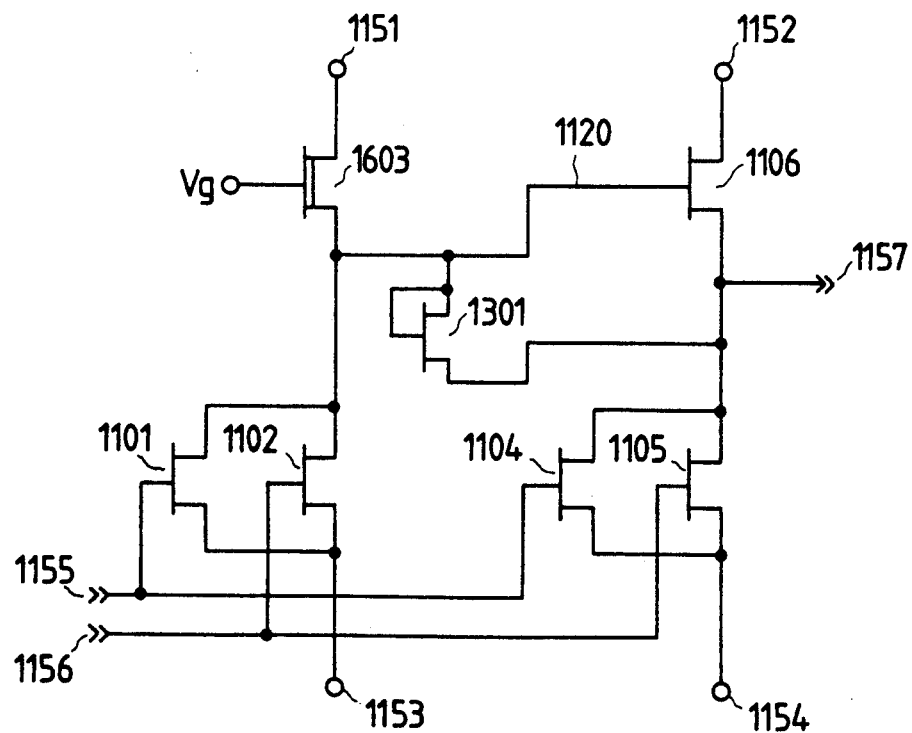

FIG. 27 shows a further embodiment. In this example, the source electrodes of the respective FETs 1301 and 1106 are connected to each other. In this circuit, as in the embodiments of FIG. 22 et. seq., the clamp circuit is configured of the FET 1301 and the FETs 1101–1105 of the next-stage circuit. With such a configuration, in comparison with the embodiment of FIG. 26, the number of output terminals decreases to one, but as to the pulling-down FETs 11501, 11502, 1104 and 1105, only 1104 and 1105 can be shared. Moreover, the current to flow through the clamp circuit can be effectively utilized also for charging and discharging the output terminal 1157.

Figure 28:
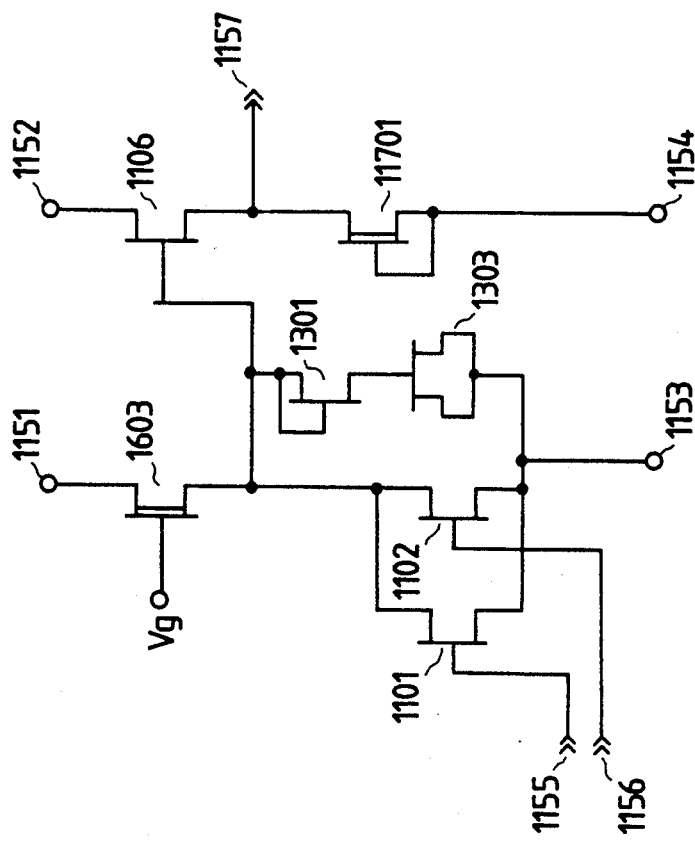

FIG. 28 shows a still further embodiment. This embodiment is such that the concept of the embodiment in FIG. 25 is applied to the embodiment in FIG. 17. Instead of the pulling-down FETs 1104 and 1105 in FIG. 17, a normally-on type FET 11701 is interposed between the source electrode of the FET 1106 and the minus side voltage source 1154. Owing to this arrangement, the number of FETs can be decreased. The output fall at the output terminal 1157 is quickened by a discharge operation based on the FET 11701.

Figure 30:
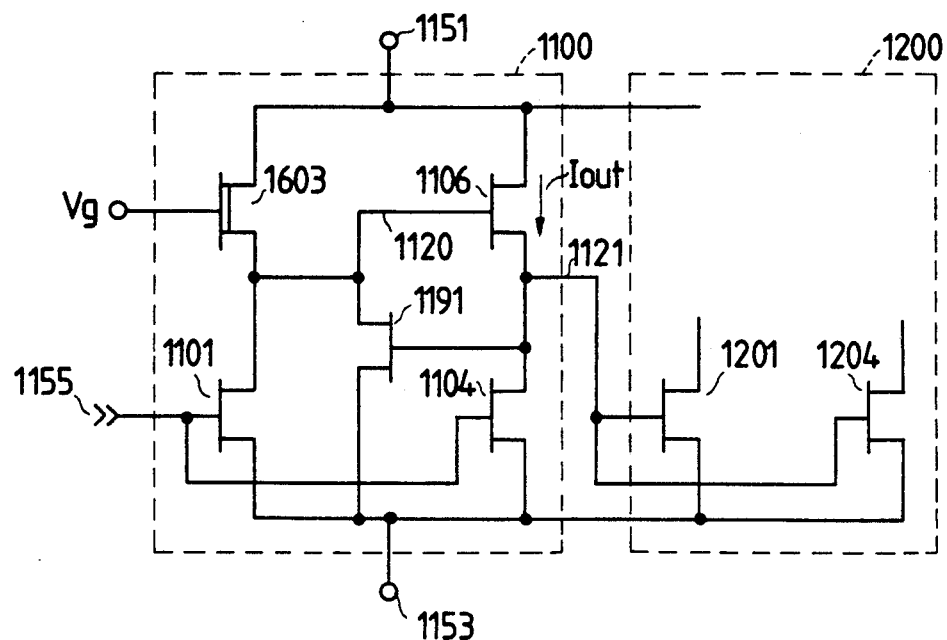
FIGS. 30 and 31 show further variations of the clamping circuit.

FIG. 30 shows still another embodiment of the present invention. Here, FETs/301 and/303 for clamping in FIG. 17 are replaced with a normally-on type FET/191. When the low level signal is applied at the input terminal/155, no current flows in the FET/104. Accordingly, the current $I_{out}$ of the FET 106 flows into the gate electrodes of the FETs/191, /201, and/204. The output voltage level V/121 is determined by the current Iout and the voltage-current characteristics of the gate-source Schottky diodes of the FETs/191, /201 and/204. The current $I_{out}$ in line 1121 is determined by the gate-source voltage $V_{gs}$ (FET/106), and is also determined by the voltage difference between the lead/120 and negative supply voltage. The potential V(1120) of the lead/120 is determined so that the currents in the FETs/191 and /603 may become equal.

Figure 37:
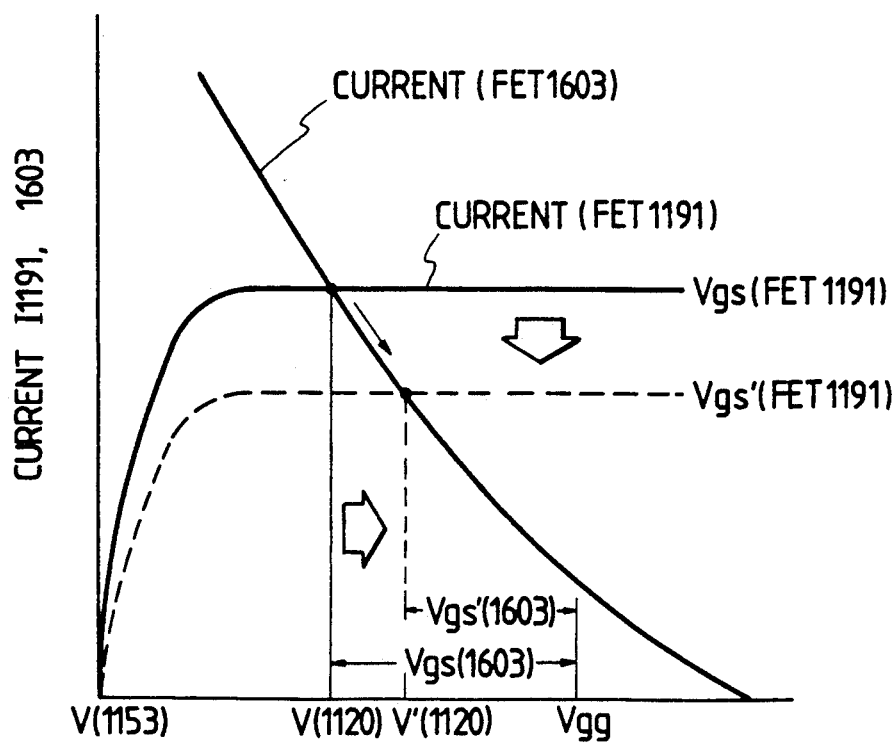
FIG. 37 shows characteristics of the circuit in FIG. 30.

FIG. 37 shows the relationships between the currents I(FET/603) and I(FET.191) of the FETs/603 and /191, respectively and the potential V(/120) of the lead/120. From this figure it is clear that the current $I_{out}$ of the FET 106 is little changed with the change of the supply voltage. When the negative supply voltage rises, for example, the gate-source voltage $V_{gs}$(FET/191) is lowered and becomes $V_{gs}'$ (FET/191), and the current I(FET/191) decreases. Accordingly, the current I(FET/603) decreases, because the same amount of current flows in the FET/603 as the FET/191. As a result, the gate-source voltage $V_{gs}$ (FET/603) is lowered to $V_{gs}'$ (FET/603) and the potential V(/120) of the lead/120 rises to V'(/120). That is, when the negative supply voltage varies, the potential of the lead/120 varies as well. Therefore, little change occurs in the potential difference between the lead/120 and the negative supply voltage/153, and the Iout varies very little with the change of the supply voltage.

As for the variations in the threshold voltage $V_{th}$ of the FETs, the similar compensation is achieved. When $V_{th}$ rises, for example, the current in FET/191 decreases and the gate-source voltage $V_{gs}$ (FET/603) is lowered, followed by the rise of the potential of the lead/120. Consequently, the gate-source voltage of the FET/106 increases and the decrease in the current $I_{out}$ of the FET/106 is compensated.

As described above, according to the present invention, little change occurs in $I_{out}$ of the current FET/106 with the change in the supply voltage and the threshold voltage of the FETs.

Moreover, this embodiment has a merit in achieving high speed. Explaining in detail, when the input signal at the input terminal/155 falls, no current flows in the FET/191 until the potential of the output terminal/121 becomes a high level. Accordingly, almost all the current from the FET/603 can be used for quickly raising the potential of the lead/120. On the other hand, when the input signal rises, almost all the current in the FET/101 can be used for quickly lowering the potential of the lead/120. That is because the FET/191 is in the "ON" state and flows current of the FET/603 until the output terminal/121 becomes a low level.

Figure 31:
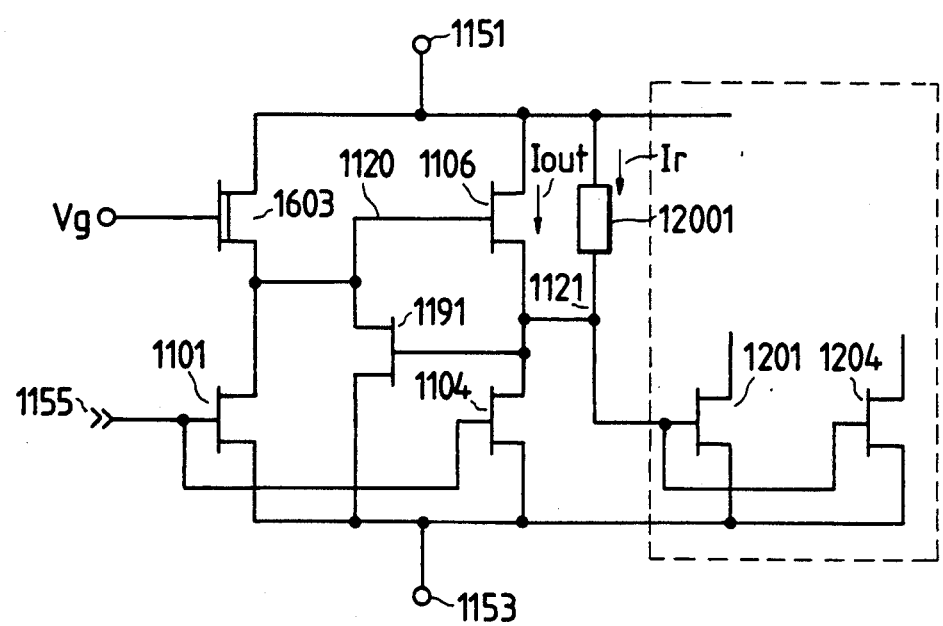

FIG. 31 shows still another embodiment, where the load element/2001 is inserted between the source and drain of the FET/106. In this configuration the DC current from both of the FET/106 and the load/2001 flows into the next-stage circuits when the output level is high. Consequently, the DC current in the FET/106 can be decreased without lowering the high output level because the load/2001 can flow necessary current to keep a high level. This situation leads to the merit that the gate width of the FEt/106 can be designed according to the necessary transient characteristics, rather than the DC current.

Figure 32A:
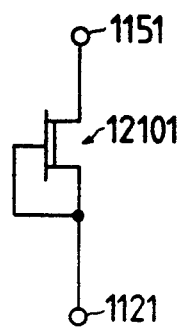
FIGS. 32(a) and (b) show examples of the leakage load for the circuit of FIG. 31.
Figure 32B:
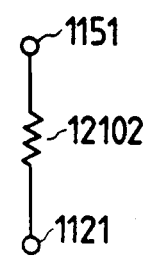

FIG. 32 shows examples of the load element/2001 in FIG. 31. In FIG. 32(a) a normally-on type FET/2101 is used, and in FIG. 21(b) a simple resistor/2102.

Figure 33:
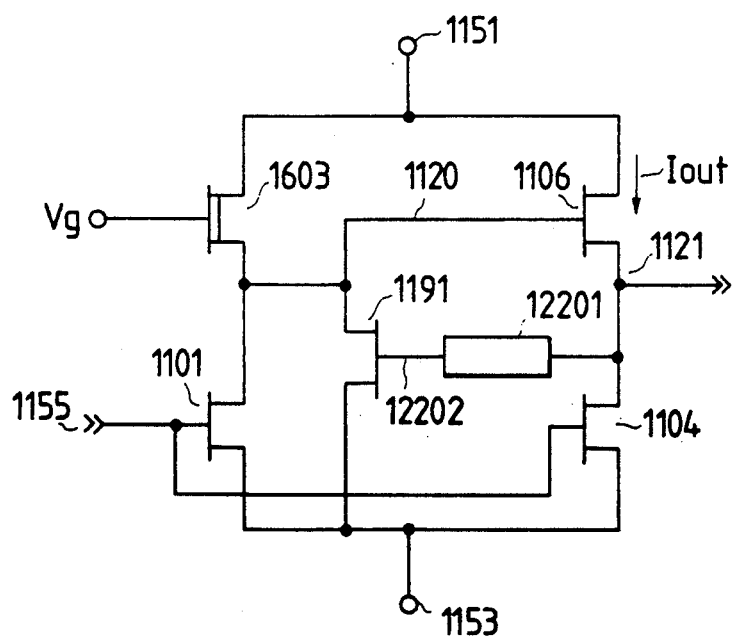
FIG. 33 shows a delay as a part of the clamping circuit.

FIG. 33 shows still another embodiment, as a variation of the circuit in FIG. 30. The delay element/2201 is inserted between the gate electrode of the FET/191 and the output terminal/121. Comparing with the embodiments of FIG. 30 and FIG. 31, the DC characteristics of this embodiment are the same, but higher speed can be achieved. This is because the response of the FET/191 is delayed and when the input signal falls, for example, during the delay time the current from the FET/603 can be used for raising the potential of the lead/120. This embodiment can be applied also to the configuration in FIG. 31.

Figure 34A:
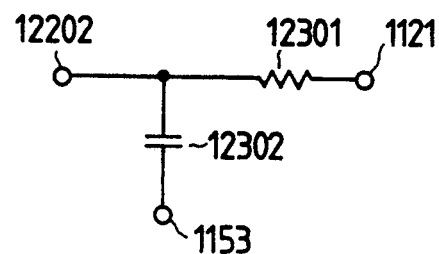
FIGS. 34(a) and (b) show examples of the delay circuit for FIG. 33.
Figure 34B:
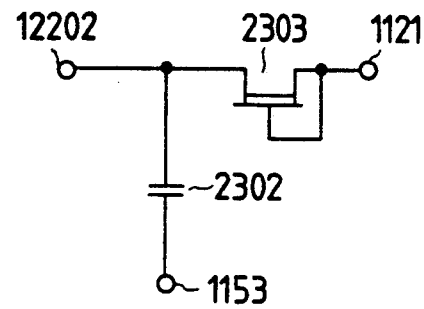

FIGS. 34(a) and (b) show other examples of the delay element /2201 in FIG. 33. In FIG. 34(a) the delay element/2201 is the resistor/2301 and the capacitor/2302. In FIG. 34(b) the resistor/2301 is replaced with the normally-on type FET/2303.

Figure 35:
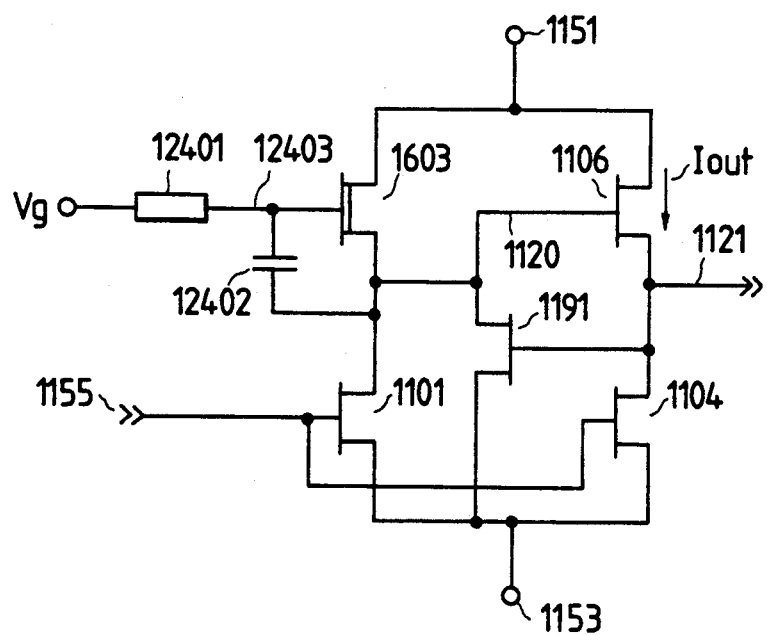
FIG. 35 shows a load bootstrap circuit usable with any of the embodiments.

FIG. 35 shows still another embodiment, where the resistor element/2401 and the capacitor/2402 are added to the embodiment shown in FIG. 30. In this embodiment the potential of the gate of the FET/603 responds to the change of the potential of the lead/120 by way of the capacitor/2402. Accordingly, the current of the FET/603 changes little and is used effectively to raise or lower the potential of the lead/120. This leads to the decrease of the delay time. The bias Vg can be applied through the resistor/2401, the impedance of which is large.

Figure 36A:
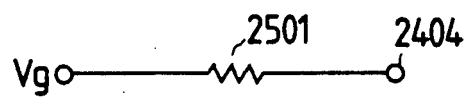
FIGS. 36(a)–(c) show examples of the bootstrap circuit impedance.
Figure 36B:
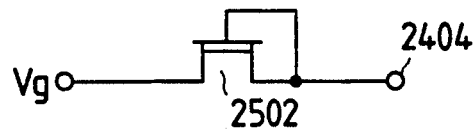
Figure 36C:
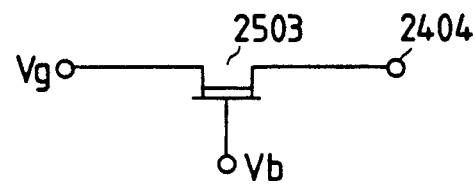

FIGS. 36(a)-(c) show examples of the resistor element/2401 in FIG. 35. In FIG. 36(a), (b) and (c), the element/2401 is realized by the resistor/2501 with the gate and source electrodes connected, and the normally-on type FET/2503 with the gate applied a fixed bias Vb, respectively.

It is clear that the configuration of this embodiment shown in FIGS. 35 and 36(a)–(c) can be applied to other embodiments of the present invention, for example, FIG. 17 and FIGS. 20 through 28.

In FIG. 14, the FET 1301 whose gate and drain are shorted is used as part of the clamp circuit, and this is intended to hold Eqs. (1) and (2) in correspondence with the FET 1106 for pulling up the output. However, when it is unnecessary to hold such precise conditions, a diode such as Schottky diode may well be used. Besides, although the FET 1603 is employed as the load element 1103 in FIG. 20, it is obvious from the above description that the FET 1503 as shown in FIG. 16 or a mere resistor may well be employed.

As described above, according to the present invention, a circuit of ultrahigh speed which is very stable against fluctuations in the voltages of voltage sources and the threshold voltages $V_{th}$ of devices can be realized.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A logic circuit for receiving one or more inputs signals and producing a logic operation output based on the inputs, comprising:
   at least one input;
   a first group of one or more field-effect transistors, each having a gate connected to a respective input to receive one of the input signals, respectively;
   a second group of field-effect transistors equal in number to the first group of transistors, and each transistor of said second group of transistors having a gate connected to a respective one of the gates of the first group of transistors to respectively receive one of the input signals;
   first load means connected to said first group of transistors and providing the load for said first group of transistors;
   second load means connected to said second group of transistors and providing the load for said second group of transistors;
   an output connected between said first load means and said first group of transistors to provide the logic operation output of the first group of transistors based upon the input signals applied to said input;
   field-effect transistor means for providing current through said output, in parallel with said first load means; and
   said field-effect transistor means having a gate controlling the current passing therethrough to said output and being connected between said second group of transistors and said second load means.

2. The logic circuit according to claim 1, wherein there are a plurality of said inputs, a corresponding plurality of transistors in said first group of transistors, and a corresponding plurality of transistors in said second group of transistors.

3. The logic circuit according to claim 2, wherein said first group of transistors have drains commonly connected together and sources commonly connected together, and said second group of transistors have drains commonly connected together and sources commonly connected together.

4. The logic circuit according to claim 3, wherein said first group of transistors and said second group of transistors each constitute means providing a NOR logic operation output based upon the input signals.

5. The logic circuit according to claim 4, wherein said transistor means is a single field-effect transistor.

6. The logic circuit according to claim 5, wherein said first and second groups consist of normally-off type field effect transistors.

7. The logic circuit according to claim 5, wherein said first load means is a normally-on type field effect transistor having a gate and a source commonly connected.

8. The logic circuit according to claim 5, wherein said first load means is a field effect transistor that has one of a drain and source being directly connected to one of the drain and source of said transistor means, and the other of said drain and source of said first load means being directly connected to the other of said drain and source of said transistor means.

9. The logic circuit according to claim 5, wherein said transistor means is a normally-off type field effect transistor.

10. The logic circuit according to claim 3, wherein said transistor means is a normally-on type field effect transistor having voltage drop means directly connected between said gate of said transistor means and said commonly connected drains of said second group of transistors.

11. The logic circuit according to claim 1, wherein said second load means is a normally-on type field effect transistor having a gate and source directly connected.

12. The logic circuit according to claim 1, wherein said second load means is a resistor.

13. The logic circuit according to claim 1, wherein said transistor means is a normally-off type field effect transistor.

14. The logic circuit according to claim 1, wherein said transistors of said first and second groups are normally-on type field effect transistor.

15. The logic circuit according to claim 1, including a circuit voltage source; and
   wherein said transistor means is directly between said circuit voltage source and said output.

16. The logic circuit according to claim 1, constructed entirely on a single chip as an integrated circuit, and wherein all of said transistors are formed with gallium arsenide.

17. The logic circuit according to claim 1, wherein each transistor of said second group of transistors is of a physical size and current carrying capacity substantially smaller than the physical size and current carrying capacity of each of the transistors of said first group of transistors.

18. The logic circuit according to claim 17, wherein each transistor of said second group of transistors is a field effect transistor having a gate width that is at least about 1/20th the gate width of each of said transistors of said first group of transistors.

19. The logic circuit according to claim 1, wherein said transistor means is a single field-effect transistor.

20. The logic circuit according to claim 1, wherein said first load means is a field effect transistor that has one of a drain and source being directly connected to one of the drain and source of said transistor means, and the other of said drain and source of said first load means being directly connected to the other of said drain and source of said transistor means.

21. The logic circuit according to claim 2, wherein said transistor means is a single field-effect transistor; including a circuit voltage source; and
wherein said transistor means is directly between said circuit voltage source and said output.

22. The logic circuit according to claim 2, constructed entirely on a single chip as an integrated circuit, and wherein all of said transistors are formed with gallium arsenide.

23. The logic circuit according to claim 2, wherein each transistor of said second group of transistors is of a physical size and current carrying capacity substantially smaller than the physical size and current carrying capacity of each of the transistors of said first group of transistors.

24. The logic circuit according to claim 23, wherein each transistor of said second group of transistors is a field effect transistor having a gate width that is at least about 1/20th the gate width of each of said transistors of said first group of transistors.

25. A logic circuit for receiving one or more input signals and producing a logic operation output based upon the inputs, comprising:
an output;
at least one input;
a first circuit voltage source;
a first group of one or more field-effect transistors, each having a gate connected to a respective input to receive one of the input signals, respectively;
first load means connected to said first group of transistors and providing the load for said first group of transistors;
field-effect transistor means for providing current through said output, for changing the logic level of said output in accordance with the logic operation output of the first group of transistors, and having a gate controlling the current passing therethrough to said output, and connected between said first group of transistors and said first load means; and
voltage clamping means in parallel with said first group of transistors and directly connected to said gate of said transistor means for clamping the gate voltage of said transistor means.

26. A logic circuit according to claim 25,
including a second circuit voltage source;
a digital circuit having an input circuit with a Schottky diode connected between said first voltage source and said output;
wherein said clamping means clamps the voltage level of the gate of said transistor means at a value related to said first voltage source substantially independent of the threshold voltage of said transistor means and the Schottky diode voltage between the input and said first voltage source for said digital circuit;

27. A logic circuit according to claim 26, wherein said digital circuit is a logic circuit substantially sharing common circuit voltage sources with said first-mentioned logic circuit.

28. A logic circuit according to claim 25, including a second group of field-effect transistors equal in number to the first group of transistors, and each transistor of said second group of transistors having a gate connected to a respective one of the gates of the first group of transistors to respectively receive one of the input signals;
a second load means connected to said second group of transistors and providing the load for said second group of transistors;
an output connected between one of said load means and one of said groups of transistors to provide the logic operation output based upon the input signals.

29. A logic circuit according to claim 28, wherein there are a plurality of said inputs, a corresponding plurality of transistors in said first group of transistors, and a corresponding plurality of transistors in said second group of transistors.

30. A logic circuit according to claim 29, wherein said first group of transistors have drains commonly connected together and sources commonly connected together, and said second group of transistors have drains commonly connected together and sources commonly connected together.

31. A logic circuit according to claim 30, wherein said first group of transistors and said second group of transistors each constitute means providing a NOR logic operation output based upon the input signals; and
wherein said transistor means is a single field-effect transistor.

32. A logic circuit according to claim 31, constructed entirely on a single chip as an integrated circuit.

33. A logic circuit according to claim 32, wherein each transistor of said second group of transistors is of a physical size and current carrying capacity substantially smaller than the physical size and current carrying capacity of each of the transistors of said first group of transistors.

34. A logic circuit according to claim 33, wherein each transistor of said second group of transistors is of a physical size and current carrying capacity substantially smaller than the physical size and current carrying capacity of each of the transistors of said first group of transistors.

35. A logic circuit for receiving one or more input signals and producing a logic operation output signal based upon the input, signals, comprising:
at least one input;
at least one output;
a first supply voltage;
a second supply voltage;
pull down means for discharging load capacitance at said output when the output signal falls in voltage;
a group of at least one field-effect transistor and each transistor of said group having a gate connected to a respective one of the gates of the first group of transistors input to respectively receive one of the input signals;
a load means connected at a node to said group of transistors and providing the load for said group of transistors with said group and load means series connected between said supply voltages;
said output being connected to said node between said load means and said group of transistors to provide the logic operation output of the group of transistors based upon the input signals applied to said input;
voltage clamping means in parallel with said group of transistors directly between said second voltage source and said node for clamping the node voltage at a value substantially independent of said first supply voltage.

36. A logic circuit according to claim 35, wherein field-effect transistor means for providing current through said output for changing the logic level of said output in accordance with the logic operation output of said group of transistors at said node;

said field-effect transistor means having a gate controlling the current passing therethrough to said output, and said gate being connected to said node between said group of transistors and said load means; and a second output connected to said node and bypassing said transistor means.

37. A circuit according to claim 35, further including a plurality of said logic circuits, some of which having a logic input connected to one or more of the outputs of the other logic circuits so that the fan out of one of the logic circuits is different than the fan out of another of the logic circuits; and said clamping means of said one of said logic circuits structurally differing from said clamping means of said another of said logic circuits to establish respectively different clamping voltages correlated to the different current driving requirements resulting from the difference in fan out.

38. A circuit according to claim 35, further including a plurality of said logic circuits each having a logic input connected to one or more of the outputs of the other logic circuits so that the load capacitance of one of the logic circuits is different than the load capacitance of another of the logic circuits; and said clamping means of said one of said logic circuits structurally differing from said clamping means of said another of said logic circuits to establish respectively different clamping voltages correlated to the different current driving requirements resulting from the difference in output load capacitance.

39. The logic circuit according to claim 35, wherein said clamping means includes a field effect transistor having its drain and source in series with a Schottky diode across the clamp voltage.

40. The logic circuit according to claim 36, wherein said clamping means includes a field effect transistor having its drain and source in series with a Schottky diode across the clamp voltage.

41. The logic circuit according to claim 40, wherein said clamping means field effect transistor has a threshold voltage substantially equal to the threshold voltage of the field effect transistors of said group of transistors.

42. The logic circuit according to claim 39, wherein said Schottky diode is formed between the gate and source of a field effect transistor.

43. The logic circuit according to claim 37, wherein the clamping means of said one logic circuit has a plurality of field effect transistors connected in parallel, and another logic circuit has a differing number of field effect transistors of the clamping means connected in parallel to compensate for the respective difference in output characteristics of the logic circuits.

44. The logic circuit according to claim 38, wherein the clamping means of said one logic circuit has a plurality of field effect transistors connected in parallel, and another logic circuit has a differing number of field effect transistors of the clamping means connected in parallel to compensate for the respective difference in output characteristics of the logic circuits.

45. The logic circuit according to claim 35, wherein there are a plurality of said logic circuits, at least the output of one logic circuit being connected to an input of another logic circuit; and said clamping means of said one logic circuit extending directly parallel to the series circuit from the gate of said transistor means of said one logic circuit through the output of said one logic circuit and said one input of said another logic circuit, gate of the input transistor of the first group of transistors of said another logic circuit that is connected to said one input and to one of the drain and source of said input transistor so that variations in the current flowing to said another logic circuit from said one logic circuit are minimized.

46. A single chip integrated circuit including two of the logic circuits according to claim 36; wherein said clamping means is constructed of a series connected field effect transistor and a Schottky diode matched in characteristics to the corresponding characteristics of the transistor means of one logic circuit and the Schottky diode of the input transistor of the first group of another logic circuit so that the current to flow to said another logic circuit from the one logic circuit does not change due to variations of the threshold voltage for the transistor means for the one logic means.

47. The circuit according to claim 35, wherein said clamping means includes a field effect transistor;

further including a plurality of said logic circuits connected together with different fan outs for different ones of the logic circuits; and said clamping means of said logic circuits having the gate width of their respective clamping means transistors differing from each other in a ratio corresponding to the ratio of their respective fan outs.

48. The logic circuit according to claim 35, wherein said clamping means includes a field effect transistor;

further including a plurality of said logic circuits connected together with different load capacitances at their respective outputs; and said clamping means having the gate width of their respective clamping means transistors differing from each other in a ratio corresponding to the ratio of their respective load capacitance at their outputs.

49. The logic circuit according to claim 36, including an additional output connected to the gate of said transistor means.

50. A circuit integrated on a single chip and including a plurality of logic circuits according to claim 49, some of which having an input directly connected to the physically closest one of said outputs of at least one other logic circuit.

51. A single chip integrated circuit including a plurality of the logic circuits of claim 49, and a plurality of digital circuits respectively having inputs connected to an output of at least one of said logic circuits, with the connection of the input of the digital circuit being to the physically closest output of the two outputs of its respective logic circuit.

52. The logic circuit according to claim 49, further including a field effect device connected between said transistor means gate and said additional output to match the characteristics of said transistor means between the gate of said transistor means and the firstmentioned output so that the signals at the outputs will always be substantially identical for each logic circuit.

53. A single chip integrated circuit including at least one flipflop comprising two of the logic circuits of claim 52, further including a direct connection between one of said outputs of each of said logic circuits and said input of the other logic circuit, so that the logic circuits are cross coupled;

said flipflop having two outputs directly connected respectively to the other outputs of said logic circuits; and said flipflop further having inputs respectively connected to inputs of corresponding inputs of the logic circuit.

54. A single chip integrated circuit including at least one flipflop comprising two of the logic circuits of claim 49, further including a direct connection between one of said outputs of each of said logic circuits and said input of the other logic circuit, so that the logic circuits are cross coupled;

said flipflop having two outputs directly connected respectively to the other outputs of said logic circuits; and said flipflop further having inputs respectively connected to inputs of corresponding inputs of the logic circuits.

55. A circuit having one and another logic circuits, each according to claim 36, wherein said clamping means comprises a transistor parallel connected with said gate of said transistor means and the input transistor of another logic circuit having its input connected to the output of the one logic circuit.

56. The logic circuit according to claim 35, wherein said pull down means is a field effect transistor.

57. The logic circuit according to claim 36, further including a digital circuit having an input transistor connected to the output of said logic circuit and a voltage source; and wherein said clamping means consists of a single field effect transistor having a gate coupled to said output to provide a single transistor path from the transistor means gate to said voltage source in parallel with the path from said transistor means gate to the same said voltage source that includes at least two transistors, namely, said transistor means and the input transistor of a digital circuit connected to said output of said logic circuit.

58. The logic circuit according to claim 35, wherein said clamping means has a field effect transistor.

59. The logic circuit according to claim 58, including delay means for delaying the turning on of said clamping means transistor for a period of time that is a substantial portion of the rise time of the output signal on the output from low to high.

60. The logic circuit according to claim 59, wherein field-effect transistor means for providing current through said output, in parallel with said load means for changing the logic level of said output in accordance with the logic operation output of said group of transistors at said node;

said field-effect transistor means having a gate controlling the current passing therethrough to said output, and said gate being connected to said node between said group of transistors and said load means; and a second output connected to said node and bypassing said transistor means.

61. The logic circuit according to claim 58, further including delay means connected between said output and said gate of said clamping means transistor for delaying the turning on of said clamping means transistor for a period of time that is substantially all of the rise time of the output signal on the output from low to high.

62. The logic circuit according to claim 61, wherein field-effect transistor means for providing current through said output, in parallel with said load means for changing the logic level of said output in accordance with the logic operation output of said group of transistors at said node;

said field-effect transistor means having a gate controlling the current passing therethrough to said output, and said gate being connected to said node between said group of transistors and said load means; and a second output connected to said node and bypassing said transistor means.

63. The logic circuit according to claim 35, wherein said clamping is substantially not conducting when a logic low is on said output and is substantially current conducting when a logic high is on said output, and said clamping means further including delay means for delaying the change from nonconducting to conducting of said clamping means when the output signal transits from low to high.

64. The logic circuit according to claim 63, wherein field-effect transistor means for providing current through said output, in parallel with said load means for changing the logic level of said output in accordance with the logic operation output of said group of transistors at said node;

said field-effect transistor means having a gate controlling the current passing therethrough to said output, and said gate being connected to said node between said group of transistors and said load means; and a second output connected to said node and bypassing said transistor means.

65. The logic circuit according to claim 35, wherein said clamping means is substantially not current conducting when a logic low is on said output and is substantially current conducting when a logic high is on said output, and said clamping means further including delay means for delaying the change from nonconducting to conducting of said clamping means when the output signal transits from low to high, with the delay time being substantially equal to the entire rise time from low to high at the output to prevent said clamping means from substantially diverting the charging current away from the capacitance loading of said output during a substantial portion of the output rise time.

66. The logic circuit according to claim 65, wherein field-effect transistor means for providing current through said output, in parallel with said load means for changing the logic level of said output in accordance with the logic operation output of said group of transistors at said node;

said field-effect transistor means having a gate controlling the current passing therethrough to said output, and said gate being connected to said node between said group of transistors and said load means; and a second output connected to said node and bypassing said transistor means.

67. The logic circuit according to claim 65, wherein said delay means is an impedance-capacitance circuit.

68. The logic circuit according to claim 67, where the impedance portion of said impedance-capacitance circuit is a gate to source coupled field effect transistor.

69. The logic circuit according to claim 36, wherein said load means includes a normally on field effect transistor having its gate connected to a circuit voltage supply with an impedance and including a capacitor connected between the gate and source of the normally on transistor to provide bootstrap means for the input transistor.

70. A logic circuit for receiving one or more input signals and producing a logic operation output based upon the inputs, comprising:
an output;
at least one input;
a first circuit voltage source;
a first group of one or more field-effect transistors, each having a gate connected to a respective input to receive one of the input signals, respectively;
first load means connected to said first group of transistors and providing the load for said first group of transistors;
field-effect transistor means for providing current through said output, for changing the logic level of said output in accordance with the logic operation output of the first group of transistors, and having a gate controlling the current passing therethrough to said output, and connected between said first group of transistors and said first load means; and
including an additional output connected to the gate of said transistor means.

71. A circuit integrated on a single chip and including a plurality of logic circuits according to claim 70, some of which having an input directly connected to the physically closest one of said outputs of at least one other logic circuit.

72. A single chip integrated circuit including a plurality of the logic circuits of claim 70, and a plurality of digital circuits respectively having inputs connected to an output of at least one of said logic circuits, with the connection of the input of the digital circuit being to the physically closest output of the two outputs of its respective logic circuit.

73. The logic circuit according to claim 70, further including a field effect device connected between said transistor means gate and said additional output to match the characteristics of said transistor means between the gate of said transistor means and the first-mentioned output so that the signals at the outputs will always be substantially identical for each logic circuit.

74. A single chip integrated circuit including at least one flipflop comprising two of the logic circuits of claim 73, further including
a direct connection between one of said outputs of each of said logic circuits and said input of the other logic circuit, so that the logic circuits are cross coupled;
said flipflop having two outputs directly connected respectively to the other outputs of said logic circuits; and
said flipflop further having inputs respectively connected to inputs of corresponding inputs of the logic circuits.

75. A single chip integrated circuit including at least one flipflop comprising two of the logic circuits of claim 70, further including
a direct connection between one of said outputs of each of said logic circuits and said input of the other logic circuit, so that the logic circuits are cross coupled;
said flipflop having two outputs directly connected respectively to the other outputs of said logic circuits; and
said flipflop further having inputs respectively connected to inputs of corresponding inputs of the logic circuits.

* * * * *

REEXAMINATION CERTIFICATE (2244th)
United States Patent [19]
Kawata et al.

[11] B1 5,021,686

[45] Certificate Issued  Mar. 15, 1994

[54] LOGIC CIRCUIT

[75] Inventors: Atsumi Kawata, Hachioji; Hiroyuki Itoh, Kodaira; Hirotoshi Tanaka, Kitatsuru; Kazuhiro Yoshihara, Nishitama; Hiroki Yamashita, Hachioji, all of Japan

[73] Assignee: Hitachi, Ltd., Tokyo, Japan

Reexamination Request:
No. 90/002,570, Feb. 14, 1992

Reexamination Certificate for:
Patent No.: 5,021,686
Issued: Jun. 4, 1991
Appl. No.: 470,322
Filed: Jan. 25, 1990

[30] Foreign Application Priority Data

Jan. 25, 1989 [JP] Japan ................. 1-13903
Aug. 11, 1989 [JP] Japan ................. 1-206744

[51] Int. Cl.[5] ................. H03K 19/003; H03K 19/092; H03K 19/094; H03K 4/58
[52] U.S. Cl. ................. 307/448; 307/443; 307/451; 307/475; 307/482; 307/572; 307/578; 307/581; 307/585
[58] Field of Search ................. 307/443, 448, 450, 482, 307/578, 540, 553, 554, 558, 572, 263

[56] References Cited

U.S. PATENT DOCUMENTS

| | | | |
|---|---|---|---|
| 4,347,447 | 8/1982 | Proebstring | 307/448 |
| 4,697,110 | 9/1987 | Masuda et al. | 307/448 |
| 4,810,969 | 3/1989 | Fulkerson | 307/450 |
| 4,935,647 | 6/1990 | Larkins | 307/263 |

FOREIGN PATENT DOCUMENTS

| | | | |
|---|---|---|---|
| 0282702 | 9/1988 | European Pat. Off. | |
| 0103232 | 6/1983 | Japan | 307/448 |
| 0005618 | 1/1990 | Japan | 307/448 |
| 0155309 | 6/1990 | Japan | 307/448 |

*Primary Examiner*—Timothy P. Callahan

[57] ABSTRACT

A logic circuit, most suitable for the NOR gate, logic function and integration on a single chip with a plurality of such logic circuits and other digital circuits receiving the outputs of the logic circuits and the logic circuits themselves connected and cascade, wherein plural groups of input transistors are provided, with a load through the voltage source and one of the groups, field effect transistor between the voltage source and the other group, so that its gate is connected to the node between the load and first group and its source is connected to the output terminal, with the improvement being in finding a leakage load for the field effect transistor through the voltage source, providing a clamping circuit for the gate of the transistor. The clamping circuit can include a transistor having its gate connected to the output with a delay so that it will not come on until after a substantial portion of the rise time of the output has expired. An additional logic output may be taken from the gate of this transistor, preferably through a transistor to match the outputs, so that the logic circuit is provided with two independent outputs useful for providing adjacent logic or digital circuits with a conveniently close terminal for input, and further to take advantage of the isolation of the outputs by providing other directions for both outputs for circuit elements that must remain isolated, for example in cross coupling two logic circuits as a flipflop. One or more of the may be a field effect transistor, particularly provided with boot strapping. For otherwise identical logic circuits as a part of an overall integrated logic circuit, the clamping circuits may differ only with respect to matching respective output voltages or respective output currents with respective fan outs or other characteristics of load circuits to be driven by the outputs. Preferably, all of the elements are constructed of field effect transistors.

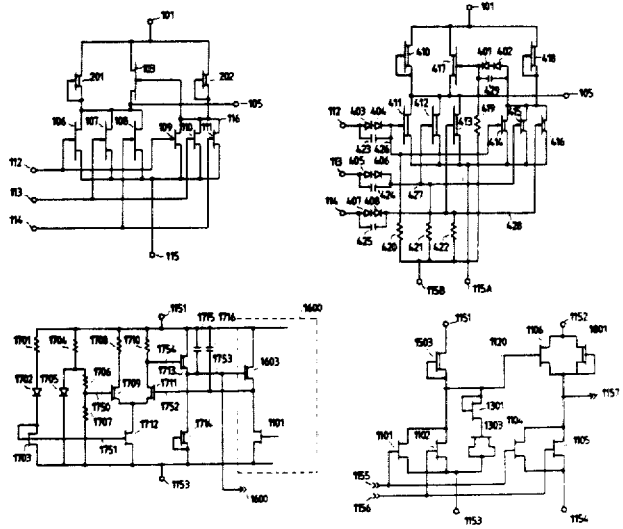

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Figure 7:
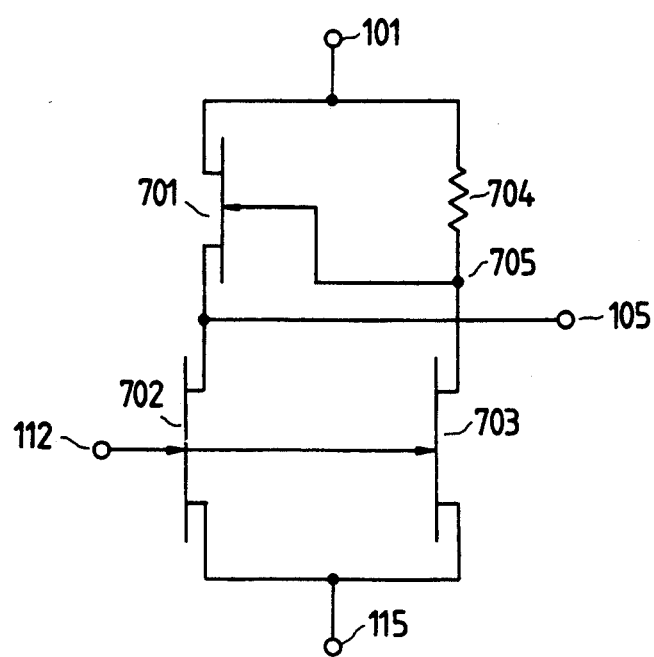

Column 2, lines 27-50:

The relationships between the currents of the several portions and the time in the case of rise of the output in the second prior-art technique shown in FIG. 7 are illustrated in FIG. 8B. Numeral 504 indicates the FET driving current through the EFET 702, and numeral 505 the current through the load FET 701. Before a time TO, since the EFET 703 is in an "on" state, the potential of the node 705 is at the low level, and the EFET 701 is supplied with the low level, so that this EFET is in an "off" state. Accordingly, the [EFT] *EFET* 702 falls into an "off" state. When the input signal begins to lower at the time TO, EFET 703 turns "off" from the "on" state, and the potential of the node 705 rises. Therefore, the load EFET 701 shifts into an "on" state and causes the current 505 to flow. As a result, the load driving current 501 flows to the output terminal 105. Even in the second prior-art technique in FIG. 7, only the EFET 701 can charge up a load capacitance. Moreover, unless the potential of the input signal becomes lower than the threshold voltage of the EFET 703, the node 705 does not reach a supply voltage 101, and this leads to the problem that a long period of time is required since the time TO until the EFET 701 causes a sufficient current to flow.

Column 13, line 32–column 15, line 7:

FIG. 30 shows still another embodiment of the present invention. Here, [FETs/301 and/303] *FETs 1301 and 1303* for clamping in FIG. 17 are replaced with a normally-on type [FET/191] *FET 1191*. When the low level signal is applied at the input [terminal/155] *terminal 1155*, no current flows in the [FET/104] *FET 1104*. Accordingly, the current $I_{out}$ of the FET [106] *1106* flows into the gate electrodes of the [FETs/191, /201, and /204] *FETs 1191, 1201 and 1204*. The output voltage level [V/121] *V1121* is determined by the current Iout and the voltage-current characteristics of the gate-source Schottky diodes of the [FETs/191, /201, and /204] *FETs 1191, 1201 and 1204*. The current $I_{out}$ in line 1121 is determined by the gate-source voltage $V_{gs}$ [(FET/106)] *(FET 1106)*, and is also determined by the voltage difference between the [lead/120] *lead 1120* and negative supply voltage. The potential V(1120) of the [lead/120] *lead 1120* is determined so that the currents in the [FETs/191] *FETs 1191* and [/603] *1603* may become equal.

FIG. 37 shows the relationships between the currents [I(FET/603)] *I(FET 1603)* and [I(FET.191)] *I(FET 1191)* of the [FETs/603] *FETs 1603* and [/191] *1191*, respectively and the potential [V(/120)] *V(1120)* of the [lead/120] *lead 1120*. From this figure it is clear that the current $I_{out}$ of the FET [106] *1106* is little changed with the change of the supply voltage. When the negative supply voltage rises, for example, the gate-source voltage [$V_{gs}$(FET/191)] $V_{gs}(FET 1191)$ is lowered and becomes [$V_{gs}$' (FET/191)] $V_{gs}'$ *(FET 1191)*, and the current [I(FET/191)] *I(FET 1191)* decreases. Accordingly, the current [I(FET/603)] *I(FET 1603)* decreases, because the same amount of current flows in the [FET/603] *FET 1603* as the [FET/191] *FET 1191*. As a result, the gate-source voltage $V_{gs}$ [(FET/603)] *(FET 1603)* is lowered to $V_{gs}'$ [(FET/603)] *(FET 1603)* and the potential [V(/120)] *V(1120)* of the [lead/120] *lead 1120* rises to [V'(/120)] *V'(1120)*. That is, when the negative supply voltage varies, the potential of the [lead/120] *lead 1120* varies as well. Therefore, little change occurs in the potential difference between the [lead/120] *lead 1120* and the negative supply [voltage/153] *voltage 1153*, and the Iout varies very little with the change of the supply voltage.

As for the variations in the threshold voltage $V_{th}$ of the FETs, the similar compensation is achieved. When $V_{th}$ rises, for example, the current in [FET/191] *FET 1191* decreases and the gate-source voltage $V_{gs}$ [(FET/603)] *(FET 1603)* is lowered, followed by the rise of the potential of the [lead/120] *lead 1120*. Consequently, the gate-source voltage of the [FET/106] *FET 1106* increases and the decrease in the current $I_{out}$ of the [FET/106] *FET 1106* is compensated.

As described above, according to the present invention, little change occurs in $I_{out}$ of the current [FET/106] *FET 1106* with the change in the supply voltage and the threshold voltage of the FETs.

Moreover, this embodiment has a merit in achieving high speed. Explaining in detail, when the input signal at the input [terminal/155] *terminal 1155* falls, no current flows in the [FET/191] *FET 1191* until the potential of the output [terminal/121] *terminal 1121* becomes a high level. Accordingly, almost all the current from the [FET/603] *FET 1603* can be used for quickly raising the potential of the [lead/120] *lead 1120*. On the other hand, when the input signal rises, almost all the current in the [FET/101] *FET 1101* can be used for quickly lowering the potential of the [lead/120] *lead 1120*. That is because the [FET/191] *FET 1191* is in the "ON" state and flows current of the [FET/603] *FET 1603* until the output [terminal/121] *terminal 1121* becomes a low level.

FIG. 31 shows still another embodiment, where the load [element/2001] *element 12001* is inserted between the source and drain of the [FET/106] *FET 1106*. In this configuration the DC current from both of the [FET/106] *FET 1106* and the [load/2001] *load 12001* flows into the next-stage circuits when the output level is high. Consequently, the DC current in the [FET/106] *FET 1106* can be decreased without lowering the high output level because the [load/2001] *load 12001* can flow necessary current to keep a high level. This situation leads to the merit that the gate width of the [FEt/106] *FET 1106* can be designed according to the necessary transient characteristics, rather than the DC current.

FIG. 32 shows examples of the load [element/2001] *element 12001* in FIG. 31. In FIG. 32(a) a normally-on type [FET/2101] *FET 12101* is used, and in FIG. 21(b) a simple [resistor/2102] *resistor 12102*.

FIG. 33 shows still another embodiment, as a variation of the circuit in FIG. 30. The delay [element/2201] *element 12201* is inserted between the gate electrode of the [FET/191] *FET 1191* and the output [terminal/121] *terminal 1121*. Comparing with the embodiments of FIG. 30 and FIG. 31, the DC characteristics of this embodiment are the same, but higher speed can be achieved. This is because the response of the [FET/191] *FET 1191* is delayed and when the input signal falls, for example, during the delay time the current from the [FET/603] *FET 1603* can be used for raising the potential of the [lead/120] *lead 1120*. This embodiment can be applied also to the configuration in FIG. 31.

FIGS. 34(a) and (b) show other examples of the delay element [/2201] *12201* in FIG. 33. In FIG. 34(a) the delay [element/2201] *element 12201* is the [resistor/2301] *resistor 12301* and the [capacitor/2302] *capacitor 12302*. In FIG. 34(b) the [resistor/2301] *resistor 12301* is replaced with the normally-on type [FET/2303] *FET 12303*.

FIG. 35 shows still another embodiment, where the resistor [element/2401] *element 12401* and the [capacitor/2402] *capacitor 12402* are added to the embodiment shown in FIG. 30. In this embodiment the potential of the gate of the [FET/603] *FET 1603* responds to the change of the potential of the [lead/120] *lead 1120* by way of the [capacitor/2402] *capacitor 12402*. Accordingly, the current of the [FET/603] *FET 1603* changes little and is used effectively to raise or lower the potential of the [lead/120] *lead 1120*. This leads to the decrease of the delay time. The bias Vg can be applied through the [resistor/2401] *resistor 12401*, the impedance of which is large.

FIGS. 36(a)-(c) show examples of the resistor [element/2401] *element 12401* in FIG. 35. In FIG. 36(a), (b) and (c), the [element/2401] *element 12401* is realized by the [resistor/2501] *resistor 12501*, the normally-on type [FET/2502] *FET 12502* with the gate and source electrodes connected, and the normally-on type [FET/2503] *FET 12503* with the gate applied a fixed bias Vb, respectively.

It is clear that the configuration of this embodiment shown in FIGS. 35 and 36(a)-(c) can be applied to other embodiments of the present invention, for example, FIG. 17 and FIGS. 20 through 28.

AS A RESULT OF REEXAMINATION, IT HAS BEEN DETERMINED THAT:

Claims 25 and 70 are cancelled.

Claims 1, 14, 20, 26-28, 34-40, 43, 45, 50, 63, 65 and 71-75 are determined to be patentable as amended.

Claims 2-13, 15-19, 21-24, 29-33, 41-42, 44, 46-49, 51-62, 64 and 66-69, dependent on an amended claim, are determined to be patentable.

New claims 76-110 are added and determined to be patentable.

1. A logic circuit for receiving [one or more inputs] *input* signals and producing a logic operation output based on the inputs, comprising:
at least one input;
a first group of one or more field-effect transistors, each having a gate connected to a respective input to receive one of the input signals, respectively;
a second group of field-effect transistors equal in number to the first group of transistors, and each transistor of said second group of transistors having a gate connected to a respective one of the gates of the first group of transistors to respectively receive one of the input signals;
first load means connected to said first group of transistors and providing the load for said first group of transistors;
second load means connected to said second group of transistors and providing the load for said second group of transistors;
an output connected between said first load means and said first group of transistors to provide the logic operation output of the first group of transistors based upon the input signals applied to said input;
field-effect transistor means for providing current through said output, in parallel with said first load means; and
said field-effect transistor means having a gate controlling the current passing therethrough to said output and being connected between said second group of transistors and said second load means.

14. The logic circuit according to claim 1, wherein said transistors of said first and second groups are normally-on type field effect [transistor] *transistors*.

20. The logic circuit according to claim 1, wherein said *transistor means includes a field effect transistor; and said* first load means is a field effect transistor that has one of a drain and source being directly connected to one of [the] *a* drain and source of said transistor means, and the other of said drain and source of said first load means being directly connected to the other of said drain and source of said transistor means.

26. A logic circuit [according to claim 25, including] *for receiving input signals and producing a logic operation output based upon the input signals, comprising:*
*an output;*
*at least one input;*
*a first circuit voltage source;*
a second circuit voltage source;
*a first group of one or more field-effect transistors, each having a gate connected to a respective input to receive one of the input signals, respectively;*
*first load means connecting said first group of transistors to said first circuit voltage source and providing the load for said first group of transistors, said first load means including a field-effect transistor having a gate being provided with a voltage determined by a voltage of said field-effect transistors of said first group;*
*field-effect transistor means for providing current through said output, for changing the logic level of said output in accordance with a logic operation output of the first group of transistors, and having a gate controlling the current passing therethrough to said output and connected between said first group of transistors and said first load means;*
*voltage clamping means in parallel with said first group of transistors and directly connected to said gate of said transistor means for clamping the gate voltage of said transistor means;*
a digital circuit having an input circuit with a Schottky diode connected between said [first] *second* voltage source and said output; *and* wherein said clamping means clamps the voltage level of the gate of said transistor means at a value related to said first voltage source substantially independent of the threshold voltage of said transistor means and the Schottky diode voltage between the [input] *output* and said [first] *second* voltage source for said digital circuit[;].

27. A logic circuit according to claim 26, wherein said digital circuit [is a logic circuit] substantially [sharing common] *shares said first and second* circuit voltage sources with said [first-mentioned logic circuit] *said first group, said first load means and said transistor means.*

28. A logic circuit [according to claim 25, including] *for receiving input signals and producing a logic operation output based upon the input signals, comprising:*
an output;
at least one input;
a first circuit voltage source;
a first group of one or more field-effect transistors, each having a gate connected to a respective input to receive one of the input signals, respectively;
first load means connecting said first group of transistors to said first circuit voltage source and providing the load for said first group of transistors, said first load means including a field-effect transistor having a gate being provided with a voltage determined by a voltage of said field-effect transistors of said first group;
field-effect transistor means for providing current through said output, for changing the logic level of said output in accordance with a logic operation output of the first group of transistors, and having a gate controlling the current passing therethrough to said output and connected between said first group of transistors and said first load means;
voltage clamping means in parallel with said first group of transistors and directly connected to said gate of said transistor means for clamping the gate voltage of said transistor mean,
a second group of field-effect transistors equal in number to the first group of transistors, and each transistor of said second group of transistors having a gate connected to a respective one of the gate of the first group of transistors to respectively receive one of the input signals;
a second load means connected to said second group of transistors and providing the load for said second group of transistors; *and*
[an] *said* output *being* connected between one of said load means and one of said groups of transistors to provide the logic operation output based upon the input signals.

34. A logic circuit according to claim [33] *31*, wherein each transistor of said second group of transistors is of a physical size and current carrying capacity substantially smaller than the physical size and current carrying capacity of each of the transistors of said first group of transistors.

35. A logic circuit for receiving one or more input signals and producing a logic operation output signal based upon the input signals, comprising:
at least one input;
at least one output;
a first supply voltage;
a second supply voltage;
pull down means for discharging load capacitance at said output when the output signal falls in voltage;
a group of at least one field-effect transistor and each transistor of said group having a gate connected to a respective one of the gates of the first group of transistors input to respectively receive one of the input signals;
a load means connected at a node to said group of transistors and providing the load for said group of transistors with said group and load means series connected between said supply voltages, *said load means including a field-effect transistor having a gate being provided with a voltage determined by a voltage of said field-effect transistors of said first group;*
connection means for connecting said output [being connected] to said node between said load means and said group of transistors to provide the logic operation output of the group of transistors based upon the input signals applied to said input; *and*
voltage clamping means in parallel with said group of transistors directly between said second voltage source and said node for clamping the *logic operation output of the group of transistors at the* node [voltage] at a value substantially independent of said first supply voltage.

36. A logic circuit according to claim 35, wherein
said connection means comprising field-effect transistor means for providing current through said output for changing the logic level of said output in accordance with the logic operation output of said group of transistors at said node;
said field-effect transistor means having a gate controlling the current passing therethrough to said output, and said gate being connected to said node between said group of transistors and said load means; and
means for connecting a second output [connected] to said node and bypassing said transistor means.

37. A circuit according to claim 35, further including a plurality of said logic circuits, some of which having a logic input connected to one or more of the outputs of the other logic circuits so that [the] *a* fan out of one of the logic circuits is different than [the] *a* fan out of another of the logic circuits; and
said clamping means of said one of said logic circuits structurally differing from said clamping means of said another of said logic circuits to establish respectively different clamping voltages correlated to the different current driving requirements resulting from the difference in fan out.

38. A circuit according to claim 35, further including a plurality of said logic circuits each having a logic input connected to one or more of the outputs of the other logic circuits so that the load capacitance of one of the logic circuits is different than the load capacitance of another of the logic circuits; and
said clamping means of said one of said logic circuits structurally differing from said clamping means of said another of said logic circuits to establish respectively different clamping voltages correlated to the different current driving requirements resulting from the difference in [output] load capacitance.

39. The logic circuit according to claim 35, wherein said clamping means includes *a Schottky diode and* a field effect transistor having its drain and source in series with [a] *the* Schottky diode across the [clamp voltage] *clamped node*.

40. The logic circuit circuit according to claim 36, wherein said clamping means includes *a Schottky diode and* a field effect transistor having its drain and source in series with [a] *the* Schottky diode across the clamp voltage.

43. The logic circuit according to claim 37, wherein the clamping means of said one logic circuit has a plurality of field effect transistors connected in parallel, and *said clamping means of said* another logic circuit has a differing number of field effect transistors [of the clamping means] connected in parallel to compensate for the respective difference in output characteristics of the logic circuits *resulting from the difference in fan out.*

45. The logic circuit according to claim [35,] *36* wherein there are a plurality of said logic circuits, at least the output of one logic circuit being connected to an input of another logic circuit; and said clamping means of said one logic circuit extending directly parallel to the series circuit from the gate of said transistor means of said one logic circuit, through the output of said one logic circuit and said one input of said another logic circuit[,] *and the* gate of the input transistor of the [first] group of transistors of said another logic circuit that is connected to said one input, and to one of the drain and source of said input transistor, so that variations in the current flowing to said another logic circuit from said one logic circuit are minimized.

50. A circuit integrated on a single chip and including a plurality of logic circuits according to claim 49, some of which having an input directly connected to [the] *an output at least one other logic circuit that is* physically closest [one of said outputs of at least one other logic circuit] *thereto.*

63. The logic circuit according to claim 35, wherein said clamping *means* is substantially not *current* conducting when a logic low is on said output and is substantially current conducting when a logic high is on said output, and said clamping means further including delay means for delaying the change from nonconducting to conducting of said clamping means when the output signal transits from low to high.

65. The logic circuit according to claim 35, wherein said clamping means is substantially not current conducting when a logic low is on said output and is substantially current conducting when a logic high is on said output, and said clamping means further including delay means for delaying the change from nonconducting to conducting of said clamping means when the output signal transits from low to high, with the delay time being substantially equal to the entire rise time from low to high at the output to prevent said clamping means from substantially diverting [the] charging current away from the capacitance loading of said output during a substantial portion of *rise time of* the output [rise time].

71. A circuit integrated on a single chip and including a plurality of logic circuits [according to claim 70], *each of said logic circuits receiving input signals and producing a logic operation output based upon the inputs and comprising:* an output;

at least one input;

a first circuit voltage source;

a first group of one or more field-effect transistors, each having a gate connected to a respective input to receive one of the input signals, respectively;

first load means connected between said first circuit voltage source and said first group of transistors and providing the load for said first group of transistors;

field-effect transistor means for providing current through said output, for changing the logic level of said output in accordance with the logic operation output of the first group of transistors, and having a gate controlling the current passing therethrough to said output and connected between said first group of transistors and said first load means;

an additional output connected to the gate of said transistor means; and wherein some of which having an input directly connected to [the] *an output of at least one other logic circuit that is* physically closest [one of said outputs of at least one other logic circuit] *thereto.*

72. A single chip integrated circuit including a plurality of the logic circuits [of claim 70, and] *for receiving input signals and producing a logic operation output based upon the inputs, each of said logic circuits comprising:*

*an output;*

*at least one input;*

*a first circuit voltage source;*

*a first group of one or more field-effect transistors, each having a gate connected to a respective input to receive one of the input signals, respectively;*

*first load means connected between said first circuit voltage source and said first group of transistors and providing the load for said first group of transistors;*

*field-effect transistor means for providing current through said output, for changing the logic level of said output in accordance with the logic operation output of the first group of transistors, and having a gate controlling the current passing therethrough to said output and connected between said first group of transistors and said first load means;*

*an additional output connected to the gate of said transistor means; and*

*said circuit further having* a plurality of digital circuits respectively having inputs connected to an output of at least one of said logic circuits, with the connection of the input of the digital circuit being to the physically closest output of the two outputs of its respective logic circuit.

73. [The] *A* logic circuit [according to claim 70, further including] *receiving input signals and producing a logic operation output based upon the inputs, comprising:*

*an output;*

*at least one input;*

*a first circuit voltage source;*

*a first group of one or more field-effect transistors, each having a gate connected to a respective input to receive one of the input signals, respectively;*

*first load means connected between said first circuit voltage source and said first group of transistors and providing the load for said first group of transistors;*

*field-effect transistor means for providing current through said output, for changing the logic level of said output in accordance with the logic operation output of the first group of transistors, and having a gate controlling the current passing therethrough to said output and connected between said first group of transistors and said first load means;*

*an additional output connected to the gate of said transistor means; and* a field effect device connected between said transistor means gate and said additional output to match the characteristics of said transistor means between the gate of said transistor means and the first-mentioned output so that the signals at the outputs will always be substantially identical [for each logic circuit].

74. A single chip integrated circuit including at least one flipflop comprising two of the logic circuits of claim 73, further including:
- a direct connection between one of said outputs of each of said logic circuits and said input of the other logic circuit, so that the logic circuits are cross coupled;
- said flipflop having two outputs directly connected respectively to the other outputs of said logic circuits; and
- said flipflop further having inputs respectively connected to [inputs of] corresponding inputs of the logic circuits.

75. A single chip integrated circuit including at least one flipflop comprising two [of the] logic circuits [of claim 70, further] *for receiving input signals and producing a logic operation output based upon the inputs, each of said logic circuits* including:
- *an output;*
- *at least one input;*
- *a first circuit voltage source;*
- *a first group of one or more field-effect transistors, each having a gate connected to a respective input to receive one of the input signals, respectively;*
- *first load means connected between said first circuit voltage source and said first group of transistors and providing the load for said first group of transistors;*
- *field-effect transistor means for providing current through said output, for changing the logic level of said output in accordance with the logic operation output of the first group of transistors, and having a gate controlling the current passing therethrough to said output and connected between said first group of transistors and said first load means;*
- *an additional output connected to the gate of said transistor means; and*
- said circuit further including a direct connection between one of said outputs of each of said logic circuits and said input of the other logic circuit, so that the logic circuits are cross coupled;
- said flipflop having two outputs directly connected respectively to the other outputs of said logic circuits; and
- said flipflop further having inputs respectively connected to [inputs of] corresponding inputs of the logic circuits.

76. A logic circuit for receiving input signals and producing a logic operation output signal based upon the input signals, comprising:
- at least one input;
- at least one output;
- a first supply voltage;
- a second supply voltage;
- pull down means for discharging load capacitance at said output when the output signal falls in voltage;
- a group of at least one field-effect transistor and each transistor of said group having a gate connected to a respective input to respectively receive one of the input signals;
- a load means connected at a node to said group of transistors and providing the load for said group of transistors with said group and load means series connected between said supply voltages;
- connection means for connecting said output to said node between said load means and said group of transistors to provide a logic operation output of the group of transistors based upon the input signals applied to said input; and
- voltage clamping means in parallel with said group of transistors directly between said second supply voltage and said node for clamping the logic operation output of the group of transistors at the node at a value determined by a current provided from said load means.

77. A logic circuit for receiving input signals and producing a logic operation output signal based upon the input signals, comprising:
- *at least one input;*
- *an output;*
- *a first supply voltage;*
- *a second supply voltage;*
- *pull down means for discharging load capacitance at said output when the output signal falls in voltage;*
- *a first group of one or more field-effect transistors, each having a drain source path between said first and second supply voltages and a gate connected to a respective input to receive one of the input signals;*
- *a first load means connecting said first supply voltage to said first group of transistors and providing the load for said first group of transistors;*
- *field-effect transistor means for providing current through said output, for changing the logic level of said output in accordance with a logic operation output of the first group of transistors, and having a gate controlling the current passing therethrough to said output and said gate being connected between said first group of transistors and said first load means; and*
- *voltage clamping means in parallel with said first group of transistors and directly connected to said gate of said transistor means for clamping the gate voltage of said transistor means, said voltage clamping means including first circuit means having a voltage drop corresponding to a gate to output voltage drop of said transistor means and second circuit means having a voltage drop corresponding to a gate to source voltage drop of said field effective transistors of said first group.*

78. A logic circuit according to claim 76, further comprising:
- said connection means comprising field-effect transistor means for providing current through said output for changing the logic level of said output in accordance with the logic operation output of said group of transistors at said node;
- said field-effect transistor means having a gate controlling the current passing therethrough to said output, and said gate being connected to said node between said group of transistors and said load means; and
- means for connecting a second output to said node and bypassing said transistor means.

79. A circuit according to claim 76, further including a plurality of said logic circuits each having a logic input connected to one or more of the outputs of the other logic circuits so that the load capacitance of one of the logic circuits is different than the load capacitance of another of the logic circuits; and
- said clamping means of said one of said logic circuits structurally differing from said clamping means of said another of said logic circuits to establish respectively different current driving requirements resulting from the difference in output load capacitance.

80. The logic circuit according to claim 76, wherein said clamping means includes a Schottky diode and a field effect transistor having its drain and source in series with said Schottky diode.

81. The logic circuit according to claim 78, wherein said clamping means includes a Schottky diode and a field effect transistor having its drain and source in series with said Schottky diode.

82. The logic circuit according to claim 81, wherein said clamping means field effect transistor has a threshold voltage substantially equal to the threshold voltage of the field effect transistors of said group of transistors.

83. The logic circuit according to claim 80, wherein said Schottky diode is formed between the gate and source of a field effect transistor.

84. A circuit according to claim 77, further further including a plurality of said logic circuits each having a logic input connected to one or more of the outputs of the other logic circuits so that the load capacitance of one of the logic circuits is different than the load capacitance of another of the logic circuits; and said clamping means of said one of said logic circuits structurally differing from said clamping means of said another of said logic circuits to establish respectively different current driving requirements resulting from the difference in output load capacitance.

85. The logic circuit according to claim 77, wherein said clamping means includes a Schottky diode and a field effect transistor having its drain and source in series with said Schottky diode.

86. The logic circuit according to claim 85, wherein said Schottky diode is formed between the gate and source of a field effect transistor.

87. The logic circuit according to claim 1, including:
a high voltage source;
a low voltage source;
said transistor means and said first load means being connected in parallel between said output and said high voltage source;
said transistors of said first and second groups being connected between said low voltage source and respective ones of said first and second load means;
said first group of transistors turning off in response to one input level to raise the voltage at said output and supply output current through said first load means;
said second group of transistors turning off to raise voltage at the gate of said transistor means to turn on said transistor means for supplying current to said output from said high voltage source and through said transistor means for overcoming output capacitance to rapidly raise the voltage of said output from low to high level.

88. The logic circuit according to claim 87, constructed entirely on a single chip as an integrated circuit, and wherein all of said transistors are formed with gallium arsenide.

89. The logic circuit according to claim 88, wherein each transistor of said second group of transistors is of a physical size and current carrying capacity substantially smaller than the physical size and current carrying capacity of each of the transistors of said first group of transistors.

90. The logic circuit according to claim 89, wherein each transistor of said second group of transistors is a field effect transistor having a gate width that is at least about 1/20th the gate width of each of said transistors of said first group of transistors.

91. A circuit constructed entirely on a single chip, including a plurality of identical logic circuits connected with output of a first logic circuit connected to inputs of second logic circuits, each logic circuit receiving input signals and producing a logic operation output based upon the input signals; and comprising:

an output;
at least one input;
a first circuit voltage source;
a first group of one or more field-effect transistors, each having a gate connected to a respective input to receive one of the input signals, respectively;
first load means connecting said first group of transistors to said first circuit voltage source and providing the load for said first group of transistors, said first load means including a field-effect transistor having a gate being provided with a voltage determined by a voltage of said field-effect transistors of said first group;
field-effect transistor means for providing current through said output, for changing the logic level of said output in accordance with a logic operation output of the first group of transistors, and having a gate controlling the current passing therethrough to said output and connected between said first group of transistors and said first load means;
voltage clamping means in parallel with said first group of transistors and directly connected to said gate of said transistor means for clamping the gate voltage of said transistor means;
a second circuit voltage source:
said voltage clamping means of said first logic circuit being directly connected between said gate of said transistor means and said second voltage source to have the same voltage drop as gate to source voltage of said transistor means of said first logic circuit and gate to source voltage of the transistor of said first group of connected second logic circuits;
each of said logic circuits having pull down transistor means connected directly between said output and said second circuit voltage source to pull said output to a low level in response to a signal of said input;
said clamping means of said first logic circuit having a field effect transistor and a Schottky diode in series for passing current from said gate to said second circuit voltage source, and respectively having a threshold voltage equal to the threshold voltage of said field-effect transistor means and the same forward voltage as a Schottky diode formed between the gate and source of said pull down transistor means and the gate to source voltage of all of said field-effect transistors of said first group of said second logic circuits that are connected to said output of said first logic circuit to maintain the current flow through said clamping means at a fixed proportion to the current flow through said output; and
said first load means providing the current passing through said clamping means when said transistors of said first group are off to turn on said transistor means, and thereby said first load means together with said clamping means control the current passing through said output.

92. The logic circuit according to claim 91, wherein said transistors are GaAs transistors.

93. The logic circuit according to claim 35, including:
transistor means and said first load means being connected in parallel between said output and said first supply voltage;
said group of transistors turning off in response to one input level to raise the voltage at said output and supply output current through said first load means; and
a second group of transistors turning off to raise voltage at the gate of said transistor means to turn on said transistor means for supplying current to said output from said high voltage source and through said transistor means for overcoming output capacitance to rapidly raise the voltage of said output from low to high level.

94. The logic circuit according to claim 93, constructed entirely on a single chip as an integrated circuit, and wherein all of said transistors are formed with gallium arsenide.

95. A circuit constructed entirely on a single chip, including a plurality of identical logic circuits, each connected with output of a first logic circuit connected to inputs of second logic circuits, said logic circuits each receiving input signals and producing a logic operation output based upon the input signals and comprising:

an output;
at least one input;
a first circuit voltage source;
a first group of one or more field-effect transistors, each having a gate connected to a respective input to receive one of the input signals, respectively;
first load means connected between said first circuit voltage source and said first group of transistors and providing the load for said first group of transistors;
field-effect transistor means for providing current through said output, for changing the logic level of said output in accordance with the logic operation output of the first group of transistors, and having a gate controlling the current passing therethrough to said output and connected between said first group of transistors and said first load means;
an additional output connected to the gate of said transistor means;
a second circuit voltage source;
voltage clamping means of said first logic circuit being directly connected between said gate of said transistor means and said second voltage source to have the same voltage drop as gate to source voltage of said transistor means of said first logic circuit and gate to source voltage of the transistor of said first group of connected second logic circuits;
each of said logic circuits having pull down transistor means connected directly between said output and said second circuit voltage source to pull said output to a low level in response to a signal of said input;
said clamping means of said first logic circuit having a field effect transistor and Schottky diode in series for passing current from said gate to said second circuit voltage source, and respectively having a threshold voltage equal to the threshold voltage of said field-effect transistor means and the same forward voltage as a Schottky diode formed between the gate and source of said pull down transistor means and the gate to source voltage of all of said field-effect transistors of said first group of said second logic circuits that are connected to said output of said first logic circuit to maintain the current flow through said clamping means at a fixed proportion to the current flow through said output; and
said first load means providing the current passing through said clamping means when said transistors of said first group are off to turn on said transistor means, and thereby said first load means together with said clamping means control the current passing through said output.

96. The logic circuit according to claim 95, wherein said transistors are GaAs transistors.

97. A circuit constructed entirely on a single chip, including a plurality of logic circuits identical to the logic circuit as claimed in claim 78 connected with said output of a first logic circuit connected to said inputs of second logic circuits, further comprising:

said voltage clamping means having the same voltage drop as gate to source voltage to said transistor means of said first logic circuit and gate to source voltage of the transistor of said first group of connected second logic circuits;
said clamping means of said first logic circuit having a field effect transistor and Schottky diode in series for passing current from said gate to said second circuit voltage source, and respectively having a threshold voltage equal to the threshold voltage of said field-effect transistor means and the same forward voltage as a Schottky diode formed between the gate and source of said pull down transistor means and the gate to source voltage of all of said field-effect transistors of said first group of said second logic circuits that are connected to said output of said first logic circuit to maintain the current flow through said clamping means at a fixed proportion to the current flow through said output; and
said first load means providing the current passing through said clamping means when said transistors of said first group are off to turn on said transistor means, and thereby said first load means together with said clamping means control the current passing through said output.

98. The logic circuit according to claim 97, wherein said transistors are GaAs transistors.

99. A circuit constructed entirely on a single chip, including a plurality of logic circuits identical to the logic circuit as claimed in claim 77 connected with said output of a first logic circuit connected to said inputs of second logic circuits, further comprising:

said voltage clamping means having the same voltage drop as gate to source voltage of said transistor means of said first logic circuit and gate to source voltage of the transistor of said first group of connected second logic circuits;
said clamping means of said first logic circuit having a field effect transistor and Schottky diode in series for passing current from said gate to said second circuit voltage source, and respectively having a threshold voltage equal to the threshold voltage of said field-effect transistor means and the same forward voltageas a Schottky diode formed between the gate and source of said pull down transistor means and the gate to source voltage of all of said field-effect transistors of said first group of said second logic circuits that are connected to said output of said first logic circuit to maintain the current flow through said clamping means at a fixed proportion to the current flow through said output; and
said first load means providing the current passing through said clamping means when said transistors of said first group are off to turn on said transistor means, and thereby said first load means together with said clamping means control the current passing through said output.

100. The logic circuit according to claim 99, wherein said transistors are GaAs transistors.

101. The circuit of claim 87 wherein all of said transistors of said first and second groups are FET transistors with Schottky diodes formed between their gate and source.

102. The circuit of claim 101 wherein all of said transistors are GaAs transistors.

103. The circuit of claim 87, constructed entirely on a single chip as an integrated circuit.

104. The circuit of claim 92, wherein all of said transistors of said first group are FET transistors with Schottky diodes formed between their gate and source.

105. The circuit of claim 93, wherein all of said transistors of said group of at least one field-effect transistor and said second group of transistors are FET transistors with Schottky diodes formed between their gate and source.

106. The circuit of claim 105, wherein all of said transistors are GaAs transistors.

107. The circuit of claim 93, constructed entirely on a single chip as an integrated circuit.

108. The circuit of claim 95, wherein all of said transistors of said first group are FET transistors with Schottky diodes formed between their gate and source.

109. The circuit of claim 97, wherein all of said transistors of said first group are FET transistors with Schottky diodes formed between their gate and source.

110. The circuit of claim 99, wherein all of said transistors of said first group are FET transistors with Schottky diodes formed between their gate and source.

* * * * *